(12) United States Patent
Lee et al.

(10) Patent No.: US 11,886,659 B2
(45) Date of Patent: Jan. 30, 2024

(54) TOUCH DISPLAY DEVICE

(71) Applicant: LG Display Co., Ltd., Seoul (KR)

(72) Inventors: Yangsik Lee, Seoul (KR); SangHyuck Bae, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 17/977,230

(22) Filed: Oct. 31, 2022

(65) Prior Publication Data

US 2023/0205358 A1    Jun. 29, 2023

(30) Foreign Application Priority Data

Dec. 27, 2021  (KR) .......................... 10-2021-0188269

(51) Int. Cl.
| | | |
|---|---|---|
| *G06F 3/041* | (2006.01) | |
| *H10K 59/40* | (2023.01) | |
| *H10K 59/122* | (2023.01) | |
| *H10K 59/123* | (2023.01) | |
| *H10K 59/124* | (2023.01) | |
| *H10K 59/131* | (2023.01) | |
| *G06F 3/044* | (2006.01) | |
| *G09G 3/3233* | (2016.01) | |

(52) U.S. Cl.
CPC ........ *G06F 3/04164* (2019.05); *G06F 3/0412* (2013.01); *H10K 59/122* (2023.02); *H10K 59/123* (2023.02); *H10K 59/124* (2023.02); *H10K 59/131* (2023.02); *H10K 59/40* (2023.02); *G06F 3/0446* (2019.05); *G06F 2203/04107* (2013.01); *G06F 2203/04111* (2013.01); *G06F 2203/04112* (2013.01); *G09G 3/3233* (2013.01); *G09G 2300/0408* (2013.01); *G09G 2300/0426* (2013.01); *G09G 2300/0842* (2013.01)

(58) Field of Classification Search
CPC .... G06F 3/0412; G06F 3/04164; H10K 59/40
See application file for complete search history.

(56) References Cited

U.S. PATENT DOCUMENTS

2018/0113531 A1*  4/2018  Na .......................... G06F 3/0412
2022/0229514 A1*  7/2022  Park ....................... H10K 59/40

* cited by examiner

*Primary Examiner* — Kevin M Nguyen
(74) *Attorney, Agent, or Firm* — Birch, Stewart, Kolasch & Birch, LLP

(57) ABSTRACT

A touch display device can include a substrate including a display area and a non-display area, a first touch electrode disposed on the substrate in the display area, a first touch line electrically connected to a touch pad disposed in the non-display area, a buffer layer disposed on the first touch electrode or the first touch line, a first driving transistor disposed on the buffer layer and included in a first sub-pixel overlapping the first touch electrode, a first gate line connected to the first sub-pixel, a first touch gate line disposed in parallel to the first gate line, and a first touch driving transistor disposed in the display area and controlling a connection between the first touch line and the first touch electrode.

18 Claims, 24 Drawing Sheets

TOUCH DISPLAY DEVICE

CROSS-REFERENCE TO RELATED APPLICATION

This application claims priority to Korean Patent Application No. 10-2021-0188269, filed in the Republic of Korea on Dec. 27, 2021, which is incorporated herein by reference in its entirety.

BACKGROUND

Field of the Disclosure

The present disclosure relates to electronic devices, and more specifically, to touch display devices.

Description of the Background Art

Display devices increasingly employ a touch-based input function that enables users to easily input information or a command to the display device in an intuitive and convenient manner, in addition to a function of displaying images or data.

In order to provide the touch-based input function, a touch display device is needed to have capabilities to accurately detect the presence or absence of a touch from a user and to detect coordinates of the touch. For touch sensing, the touch display device is needed to include a touch sensor structure and a touch circuit, and the touch sensor structure can include a plurality of touch electrodes and a plurality of touch lines for electrically connecting the touch electrodes to the touch circuit. In such a configuration, the touch circuit is needed to properly perform an intended operation in accordance with the touch sensor structure.

When the size of the touch display device increases or the touch resolution (the accuracy of touch sensing) increases, more touch electrodes can be needed, and in turn, more touch lines and touch channels can be needed due to the increased number of touch electrodes.

SUMMARY OF THE DISCLOSURE

In the technical field of the touch display device, there has been a limitation in that the number of touch lines, the number of touch pads, and the number of touch channels can increase due to an increase in the number of touch electrodes. Further, in this regard, the increase in the number of touch lines and the number of touch pads can cause the structure of an associated panel to become complicated, and the increase in the number of touch channels corresponding to the number of touch lines can cause the touch circuit to become more complicated. As a result, such a display device can have a number of limitations such as increase in the size of the touch circuit, increased manufacturing costs, and the like.

To address these issues, the inventors of the present disclosure have invented touch display devices having an advanced touch sensor structure capable of reducing the number of touch lines, the number of touch pads, and the number of touch channels even when the number of touch electrodes increases.

Embodiments of the present disclosure provide touch display devices having advanced touch sensor structures capable of reducing the number of touch lines, the number of touch pads, and the number of touch channels even when the number of touch electrodes increases.

Embodiments of the present disclosure provide touch display devices having advanced touch sensor structures that not only enable the number of touch lines, the number of touch pads, and the number of touch channels to be reduced, but enable high touch resolution to be realized.

According to aspects of the present disclosure, a touch display device is provided that includes a substrate including a display area and a non-display area, a first touch electrode disposed on the substrate in the display area, a first touch line electrically connected to a touch pad disposed in the non-display area, a buffer layer disposed on the first touch electrode or the first touch line, a first driving transistor included in a first sub-pixel overlapping the first touch electrode, a first gate line connected to the first sub-pixel, a first touch gate line disposed in parallel to the first gate line, and a first touch driving transistor disposed in the display area and controlling a connection between the first touch line and the first touch electrode.

In the touch display device according to aspects of the present disclosure, the first touch driving transistor of the touch display device can include a first active layer located on the buffer layer, a first node electrode electrically connected to the first touch line and electrically connected to a first side of the first active layer, a second node electrode electrically connected to the first touch electrode and electrically connected to a second side of the first active layer, a third node electrode located on a gate insulating film on the first active layer, and electrically connected to the first touch gate line or formed by the extending of the first touch gate line.

In some embodiments, the touch display device can further include a first touch interlayer insulating film disposed on the substrate and disposed under the buffer layer.

In the touch display device according to aspects of the present disclosure, the first touch electrode of the touch display device can be located between the substrate and the first touch interlayer insulating film, and the first touch line can be located between the first touch interlayer insulating film and the buffer layer.

In some embodiments, the touch display device can further a first touch interlayer insulating film on the substrate and a second touch interlayer insulating film disposed on the first touch interlayer insulating film and under the buffer layer.

In the touch display device according to aspects of the present disclosure, the first touch electrode of the touch display device can be located between the first touch interlayer insulating film and the second touch interlayer insulating film, and the first touch line can be located between the first touch interlayer insulating film and the buffer layer.

In some embodiments, the touch display device can include the first touch interlayer insulating film on the substrate, and the second touch interlayer insulating film disposed on the first touch interlayer insulating film and under the buffer layer.

In the touch display device according to aspects of the present disclosure, the first touch electrode of the touch display device can be located between the first touch interlayer insulating film and the second touch interlayer insulating film, and the first touch line can be located between the substrate and the first touch interlayer insulating film.

In some embodiments, the touch display device can further include a first switching signal line for delivering a first switching signal for turning on a first touch driving transistor, a first control transistor for controlling a connection between the first switching signal line and the first touch gate line.

According to aspects of the present disclosure, a touch display device is provided that includes a substrate including a display area and a non-display area, a first touch electrode and a second touch electrode disposed in the display area, a first driving transistor disposed adjacent to the first touch electrode, a second driving transistor disposed adjacent to the second touch electrode, a first touch line electrically connected to the first touch electrode through the first touch driving transistor and electrically connected to the second touch electrode through the second touch driving transistor, a first touch gate line electrically connected to a gate node of the first touch driving transistor, and a second touch gate line electrically connected to a gate node of the second touch driving transistor.

In some embodiments, the touch display device can further include a first switching signal line for delivering a first switching signal for turning on the first touch driving transistor, a second switching signal line for delivering a second switching signal for turning on the second touch driving transistor, a first control transistor for controlling a connection between the first touch gate line and the first switching signal line, and a second control transistor for controlling a connection between the second touch gate line and the second switching signal line.

In the touch display device according to aspects of the present disclosure, the first control transistor and the second control transistor included in the touch display device can be disposed in the non-display area.

According to embodiments of the present disclosure, the touch display device can be provided that has the advanced touch sensor structure capable of reducing the number of touch lines, the number of touch pads, and the number of touch channels even when the number of touch electrodes increases.

According to embodiments of the present disclosure, the touch display device can be provided that has the advanced touch sensor structure that not only enables the number of touch lines, the number of touch pads, and the number of touch channels to be reduced, but enables high touch resolution to be realized.

BRIEF DESCRIPTION OF THE DRAWINGS

The accompanying drawings, which are included to provide a further understanding of the disclosure and are incorporated in and constitute a part of the disclosure, illustrate aspects of the disclosure and together with the description serve to explain the principle of the disclosure. In the drawings.

DETAILED DESCRIPTION OF THE EMBODIMENTS

Figure 1:
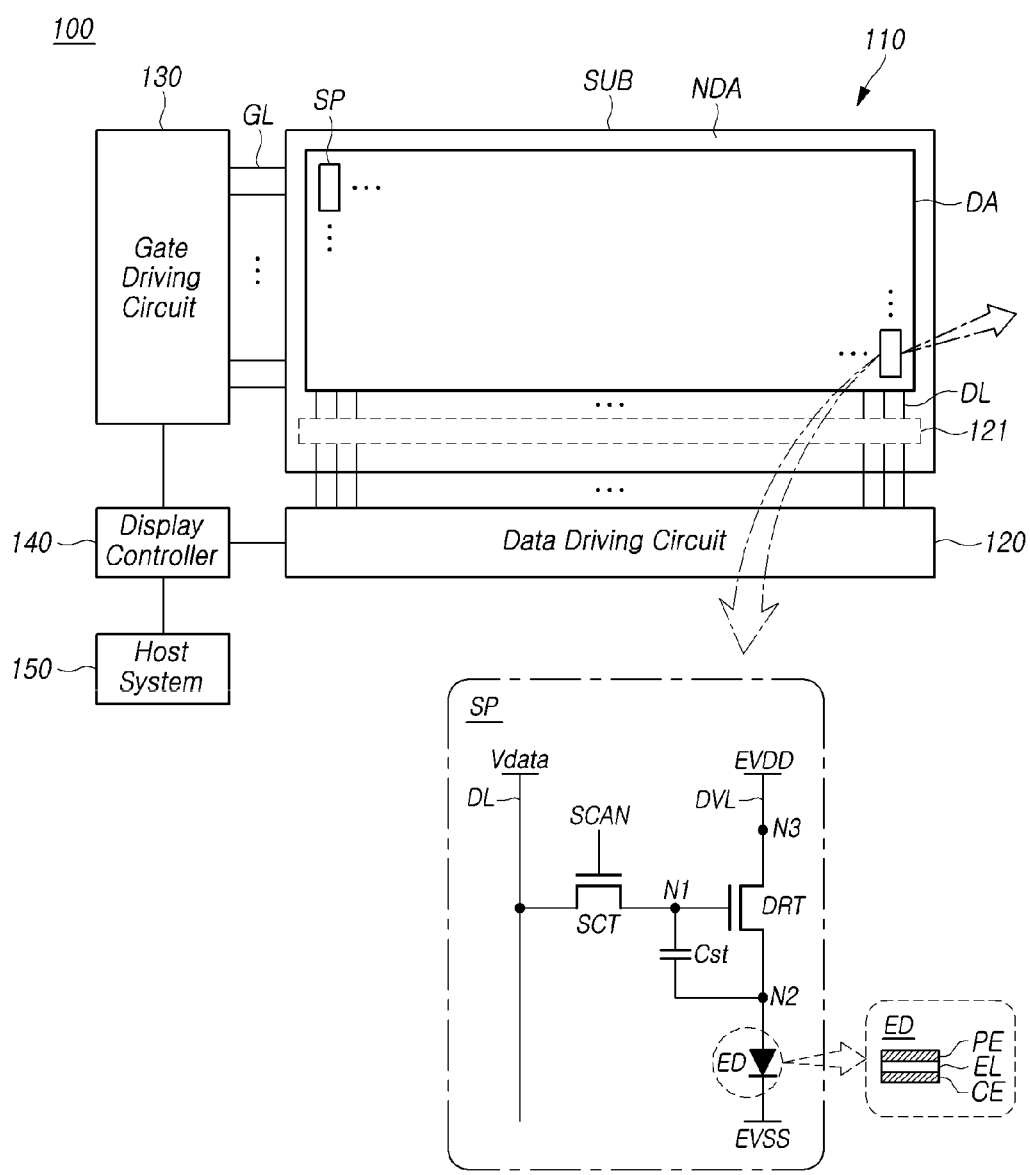
FIG. 1 illustrates a system configuration for display driving in a touch display device according to aspects of the present disclosure.

In the following description of examples or embodiments of the present disclosure, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the present disclosure, detailed descriptions of well-known functions and components incorporated herein will be omitted when it is determined that the description can make the subject matter in some embodiments of the present disclosure rather unclear. The terms such as "including", "having", "containing", "constituting" "make up of", and "formed of" used herein are generally intended to allow other components to be added unless the terms are used with the term "only". As used herein, singular forms are intended to include plural forms unless the context clearly indicates otherwise.

Terms, such as "first", "second", "A", "B", "(A)", or "(B)" can be used herein to describe elements of the present disclosure. Each of these terms is not used to define essence, order, sequence, or number of elements etc., but is used merely to distinguish the corresponding element from other elements.

When it is mentioned that a first element "is connected or coupled to", "contacts or overlaps" etc. a second element, it should be interpreted that, not only can the first element "be directly connected or coupled to" or "directly contact or overlap" the second element, but a third element can also be "interposed" between the first and second elements, or the first and second elements can "be connected or coupled to", "contact or overlap", etc. each other via a fourth element. Here, the second element can be included in at least one of two or more elements that "are connected or coupled to", "contact or overlap", etc. each other.

When time relative terms, such as "after," "subsequent to," "next," "before," and the like, are used to describe processes or operations of elements or configurations, or flows or steps in operating, processing, manufacturing methods, these terms can be used to describe non-consecutive or non-sequential processes or operations unless the term "directly" or "immediately" is used together.

In addition, when any dimensions, relative sizes etc. are mentioned, it should be considered that numerical values for an elements or features, or corresponding information (e.g., level, range, etc.) include a tolerance or error range that can be caused by various factors (e.g., process factors, internal or external impact, noise, etc.) even when a relevant description is not specified. Further, the term "may" fully encompasses all the meanings of the term "can".

Furthermore, the term such as "on" preferably means "on", "above", "over", etc., and all these terms can be interchangeably used. Similarly, the term such as "under" preferably means "below", "beneath", etc., and all these terms can be interchangeably used.

Hereinafter, with reference to the accompanying drawings, various embodiments of the present disclosure will be described in detail. All the components of each touch display device according to all embodiments of the present disclosure are operatively coupled and configured.

FIG. 1 illustrates a system configuration for display driving in a touch display device 100 according to aspects of the present disclosure.

Referring to FIG. 1, the display driving system of the touch display device 100 according to aspects of the present disclosure includes a display panel 110 and a display driving circuit for driving the display panel 110.

The display panel 110 can include a display area DA in which an image is displayed and a non-display area NDA in which an image is not displayed. The display panel 110 can include a substrate SUB, and several types of transistors and signal lines disposed on the substrate SUB. The substrate SUB can include a display area DA and a non-display area NDA.

The display panel 110 can include a plurality of sub-pixels SP for image display. For example, the plurality of sub-pixels SP can be disposed in the display area DA. In some instances, at least one sub-pixel SP can be disposed in the non-display area NDA. The at least one sub-pixel SP disposed in the non-display area NDA can be referred to as a dummy sub-pixel.

For driving the plurality of sub-pixels SP, a plurality of signal line can be disposed in the display panel 110. For example, the plurality of signal lines can include a plurality of data lines DL and a plurality of gate lines GL. The signal lines can further include other types of signal lines, in addition to the plurality of data lines DL and the plurality of gate lines GL, according to a structure of the sub-pixel SP. For example, driving voltage lines DVL, and the like can be disposed in the display panel 110.

The plurality of data lines DL and the plurality of gate lines GL can intersect each other. Each of the plurality of data lines DL can be disposed to extend in a first direction. Each of the plurality of gate lines GL can be disposed to extend in a second direction. For example, the first direction can be a column or vertical direction, and the second direction can be a row or horizontal direction. Herein, the column direction and the row direction are not absolute directions, but relative directions. For example, the column direction can be the vertical direction and the row direction can be the horizontal direction. In another example, the column direction can be the horizontal direction and the row direction can be the vertical direction.

The display driving circuit can include a data driving circuit 120 for driving the plurality of data lines DL and a gate driving circuit 130 for driving the plurality of gate lines GL, and can further include a display controller 140 for controlling the data driving circuit 120 and the gate driving circuit 130.

The data driving circuit 120 is a circuit for driving the plurality of data lines DL and can output data voltages (data signals) corresponding to the image signals to the plurality of data lines DL.

The gate driving circuit 130 is a circuit for driving the plurality of gate lines GL, and can generate gate signals and output the generated gate signals to the plurality of gate lines GL.

The display controller 140 can control scanning operation to be performed according to timings scheduled in each frame and can control data driving according to scanning timings. The display controller 140 can convert image data inputted from a host system 150 to a data signal form used in the data driving circuit 120 and supply the converted image data resulting from the converting to the data driving circuit 120.

The display controller 140 can receive display driving control signals from the host system 150 together with image data inputted. For example, the display driving control signals can include a vertical synchronization signal VSYNC, a horizontal synchronization signal HSYNC, an input data enable signal DE, a clock signal, and the like.

The display controller 140 can generate data driving control signals and gate driving control signals based on display driving control signals (e.g., VSYNC, HSYNC, DE, clock signal, etc.) inputted from the host system 150.

The display controller 140 can control the driving operation and driving timing of the data driving circuit 120 by supplying the data driving control signals to the data driving circuit 120. For example, the gate driving control signals can include a gate start pulse GSP, a gate shift clock GSC, a gate output enable signal GOE, and the like.

The display controller 140 can control the driving operation and driving timing of the gate driving circuit 130 by supplying the gate driving control signals to the gate driving circuit 130. For example, the data driving control signals can include a source start pulse SSP, a source sampling clock SSC, a source output enable signal SOE, and the like.

The data driving circuit 120 can include one or more source driver integrated circuits SDIC. Each source driver integrated circuit SDIC can include a shift register, a latch circuit, a digital-to-analog converter, an output buffer, and the like. In some embodiments, each source driver integrated circuit SDIC can further include an analog-to-digital converter.

In some embodiments, the source driver integrated circuit SDIC can be connected to the display panel 110 in a tape automated bonding (TAB) type, or connected to a conductive pad such as a bonding pad of the display panel 110 in a chip on glass (COG) type or a chip on panel (COP) type, or connected to the display panel 110 in a chip on film (COF) type.

In some embodiments, the gate driving circuit 130 can be connected to the display panel 110 in the tape automated bonding (TAB) type, or connected to a conductive pad such as a bonding pad of the display panel 110 in the chip on glass (COG) type or the chip on panel (COP) type, or connected to the display panel 110 in the chip on film (COF) type. In another embodiment, the gate driving circuit 130 can be disposed in the non-display area NDA of the display panel 110 in a gate in panel (GIP) type. The gate driving circuit 130 can be disposed on or over the substrate or connected to the substrate. For example, in the case of the GIP type, the gate driving circuit 130 can be disposed in the non-display area NDA of the substrate. The gate driving circuit 130 can be connected to the substrate in the case of the chip on glass (COG) type, the chip on film (COF) type, or the like.

At least one of the data driving circuit 120 and the gate driving circuit 130 can be disposed in the display area DA. For example, at least one of the data driving circuit 120 and the gate driving circuit 130 can be disposed not to overlap sub-pixels SP, or disposed to overlap one or more, or all, of the sub-pixels SP.

The data driving circuit 120 can be connected to a data pad unit 121 located in only one side or portion (e.g., an upper edge or a lower edge) of the display panel 110. In some embodiments, the data driving circuit 120 can be connected to data pad units 121 located in two sides or portions (e.g., an upper edge and a lower edge) of the display panel 110, or be connected to data pad units 121 located in at least two of four sides or portions (e.g., the upper edge, the lower edge, a left edge, and a right edge) of the display panel 110 according to driving schemes, panel design schemes, or the like.

The gate driving circuit 130 can be located in only one side or portion (e.g., a left edge or a right edge) of the display panel 110. In some embodiments, the gate driving circuit 130 can be connected to two sides or portions (e.g., a left edge and a right edge) of the panel 110, or be connected to at least two of four sides or portions (e.g., an upper edge, a lower edge, the left edge, and the right edge) of the panel 110 according to driving schemes, panel design schemes, or the like.

The display controller 140 can be implemented in a separate component from the data driving circuit 120 or integrated with the data driving circuit 120 and thus implemented in an integrated circuit.

The display controller 140 can be a timing display controller used in the typical display technology, or a controller or a control device configured to additionally perform other control functions in addition to the function of the typical timing display controller. In some embodiments, the display controller 140 can be a controller or a control device different from the timing display controller, or a circuitry or a component included in the controller or the control device. The display controller 140 can be implemented with various circuits or electronic components such as an integrated circuit (IC), a field programmable gate array (FPGA), an application specific integrated circuit (ASIC), a processor, and/or the like.

The display controller 140 can be mounted on a printed circuit board, a flexible printed circuit, and/or the like and be electrically connected to the gate driving circuit 120 and the data driving circuit 130 through the printed circuit board, flexible printed circuit, and/or the like.

The display controller 140 can transmit signals to, and receive signals from, the data driving circuit 120 via one or more predefined interfaces. In some embodiments, such interfaces can include a low voltage differential signaling (LVDS) interface, an EPI interface, a serial peripheral interface (SP), and the like.

The display controller 140 can include a storage medium such as one or more registers.

In some embodiments, the touch display device 100 according to aspects of the present disclosure can be a self-emission display device in which the display panel 110 itself emits light. In examples where the touch display device 100 according to aspects of the present disclosure uses self-emission display technology, each sub-pixel SP can include at least one light emitting element.

In one embodiment, the touch display device 100 according to aspects of the present disclosure can be an organic light emitting display device in which at least one organic light emitting diode (OLED) is implemented as the at least one light emitting element. In another embodiment, the touch display device 100 according to aspects of the present disclosure can be an inorganic light emitting display device in which at least one inorganic material-based light emitting diode is implemented as the at least one light emitting element. In further another embodiment, the touch display device 100 according to aspects of the present disclosure can be a quantum dot display device in which at least one quantum dot, which is a self-emission semiconductor crystal is implemented as the at least one light emitting element.

Referring to FIG. 1, in the touch display device 100 according to aspects of the present disclosure, each subpixel SP can include a light emitting element ED, a driving transistor DRT for supplying a driving current to the light emitting element ED, a scan transistor SCT for enabling a data voltage VDATA corresponding to an image signal to be supplied to the driving transistor DRT, a storage capacitor Cst for maintaining a voltage at an approximate constant level during a predefined period.

The light emitting element ED can include a pixel electrode PE and a common electrode CE, and an emission layer EL located between the pixel electrode PE and the common electrode CE. The light emitting element ED included in the subpixel SP can be, for example, an organic light emitting diode OLED, an inorganic light emitting diode LED, a quantum dot light emitting element, a micro light emitting diode (μLED) with a size of several tens of μm, or the like.

The pixel electrode PE of the light emitting element ED can be an anode electrode (or a cathode electrode), and the common electrode CE of the light emitting element ED can be the cathode electrode (or the anode electrode). In some embodiments, a base voltage EVSS can be applied to the common electrode CE of the light emitting element ED. The base voltage EVSS can be, for example, a ground voltage or a voltage similar to the ground voltage.

The driving transistor DRT can be a transistor for driving the light emitting element ED, and include a first node N1, a second node N2, and a third node N3.

The first node N1 of the driving transistor DRT can be a gate node and be electrically connected to a source node or a drain node of the scan transistor SCT.

The second node N2 of the driving transistor DRT can be a source node or a drain node, and be electrically connected to the anode electrode AE of the light emitting element ED.

The third node N3 of the driving transistor DRT can be the drain node or the source node, and a driving voltage EVDD can be applied thereto. The third node N3 of the driving transistor DRT can be electrically connected to a driving voltage line DVL for supplying the driving voltage EVDD.

The scan transistor SCT can control a connection between the first node N1 of the driving transistor DRT and a corresponding data line DL according to a scan signal SCAN supplied through a gate line GL.

The drain node or the source node of the scan transistor SCT can be electrically connected to the data line DL. The source node or the drain node of the scan transistor SCT can be electrically connected to the first node N1 of the driving transistor DRT. The gate node of the scan transistor SCT can be electrically connected to the gate line GL to receive the scan signal SCAN.

The scan transistor SCT can be turned on by the scan signal SCAN of a turn-on level voltage and enables a data voltage Vdata supplied from the data line DL to be supplied to the first node N1 of the driving transistor DRT.

The scan transistor SCT can be turned on by the scan signal SCAN of the turn-on level voltage and turned off by the scan signal SCAN of a turn-off level voltage. In one example where the scan transistor SCT is an n-type transistor, the turn-on level voltage can be a high level voltage, and the turn-off level voltage can be a low level voltage. In another example where the scan transistor SCT is an p-type transistor, the turn-on level voltage can be a low level voltage, and the turn-off level voltage can be a high level voltage.

The storage capacitor Cst can be electrically connected between the first node N1 and the second node N2 of the driving transistor DRT and can maintain a data voltage Vdata corresponding to an image signal voltage or a voltage corresponding to the image signal voltage during one frame time.

The storage capacitor Cst can be an external capacitor intentionally designed to be located outside of the driving transistor DRT, other than an internal capacitor such as a parasitic capacitor (e.g., a Cgs, a Cgd), that can be present between the first node N1 and the second node N2 of the driving transistor DRT.

Each of the driving transistor DRT and the scan transistor SCT can be an n-type transistor or a p-type transistor. Both of the driving transistor DRT and the scan transistor SCT can be n-type transistors or p-type transistors. At least one of the driving transistor DRT and the scan transistor SCT can be an n-type transistor (or a p-type transistor), and the other can be a p-type transistor (or an n-type transistor).

The structure of each sub-pixel SP illustrated in FIG. 1 is merely an example for description, For example, each sub-pixel SP can further include one or more transistors and/or one or more capacitors. In some embodiments, sub-pixels SP can have the same structure, or at least one of the sub-pixels SP can have a different structure.

In some embodiments, the touch display device 100 according to aspects of the present disclosure can be a transparent display allowing light to enter the front (or the back), and exit the back (or the front), of the touch display device 100 or the display panel 110 included in the touch display device 100. For example, in examples where the touch display device 100 according to aspects of the present disclosure is a transparent touch display, one or more areas adjacent to one or more light emitting areas of one or more sub-pixels SP can serve as one or more transmission areas.

Figure 2:
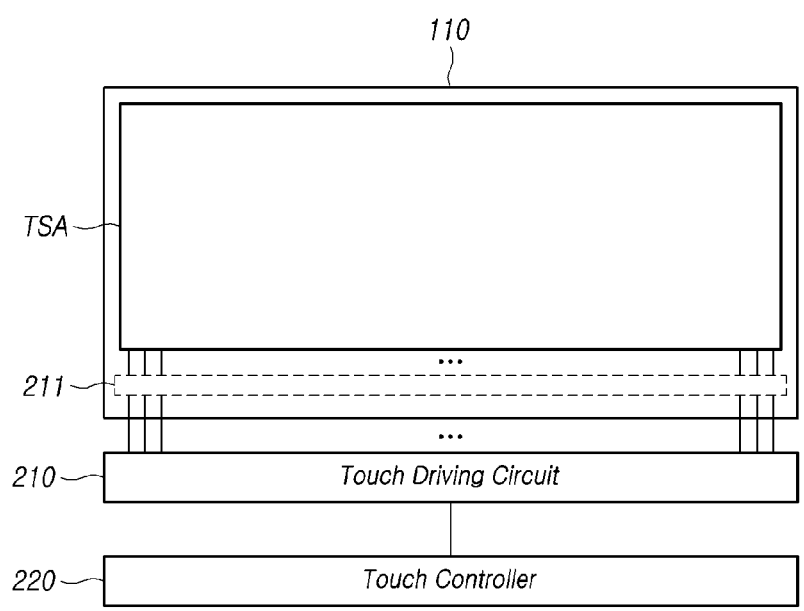
FIG. 2 illustrates a system configuration for touch sensing in the touch display device according to aspects of the present disclosure.

FIG. 2 illustrates a system configuration for touch sensing in the touch display device 100 according to aspects of the present disclosure.

Referring to FIG. 2, the touch display device 100 according to aspects of the present disclosure can include a touch sensing system for detecting a touch event by a touch pointer or a touch location of the touch pointer, as well as the image display function or configuration.

For example, the touch pointer can be a touch tool of a user such as a finger, a pen, or the like. The touching of the touch pointer on the display panel 110 can be performed such that the touch pointer touches the display panel 110 in a direct contact manner or in a contactless manner (referred to as a hover mode manner).

The touch sensing system can include a touch sensor disposed in a touch sensing area TSA, and a touch circuit capable of detecting the presence or absence of a touch and/or a touch location (touch coordinates) by driving and sensing the at least one touch sensor. Here, the touch sensor can be defined as including two or more touch sensors according to driving schemes, touch sensor design schemes, or the like.

The touch circuit can include a touch driving circuit 210 capable of outputting touch sensing data by driving and sensing the touch sensor, and a touch controller 220 capable of recognizing a touch event or determining a touch location (touch coordinates) using the touch sensing data.

The touch sensor can include touch electrodes, and further include touch lines for electrical connections between the touch electrodes and the touch driving circuit 210. Here, the touch lines can be referred to as touch routing lines.

The touch sensor can include one type of touch sensor metal, or can include two or more types of touch sensor metals.

The touch sensor can be included inside or outside of the display panel 110.

In one example where the touch sensor is integrated inside of the display panel 110, the touch sensor can be formed together while the display-related electrodes or lines are formed during the manufacturing process of the display panel 110. The touch sensor integrated inside of the display panel 110 can be referred to as an embedded type touch sensor. For example, the embedded type touch sensor can include an in-cell type touch sensor, an on-cell type touch sensor, or the like.

In another example where the touch sensor is included outside of the display panel 110, the display panel 110 and a touch panel including the touch sensor can be separately manufactured, and thereafter, the touch panel and the display panel 110 can be bonded. The touch sensor included outside of the display panel 110 can include, for example, an add-on type touch sensor, or the like.

Hereinafter, for convenience of description, it is assumed that the touch sensor is included inside of the display panel 110. However, embodiments of the present disclosure are not limited thereto.

The touch sensor can be disposed in the touch sensing area TSA. For example, the location and/or size of the touch sensing area TSA can correspond to the location and/or size of the display area DA. In another example, the location and/or size of the touch sensing area TSA can be different from the location and/or size of the display area DA.

The touch sensor can include a plurality of touch electrodes and a plurality of touch lines.

The plurality of touch electrodes can substantially serve as the touch sensor. An electrical value (e.g., capacitance, etc.) of at least one of the plurality of touch electrodes can vary according to the presence or absence of a touch by a user, for example, touching a portion overlying, or directly touches, the at least one touch electrode.

The plurality of touch lines can electrically connect the plurality of touch electrodes to the touch driving circuit 210. The touch driving circuit 210 can detect a change in an electrical value of a corresponding touch electrode through at least one of the plurality of touch lines.

In examples where the touch sensor is included inside of the display panel 110, a touch pad unit 211 can be disposed in the non-display area NDA of the display panel 110. The touch pad unit 211 can include a plurality of touch pads to which a plurality of touch lines are electrically connected and be electrically connected to the touch driving circuit 210.

The touch pad unit 211 can be disposed on or over the substrate SUB of the display panel 110 and be disposed in the non-display area NDA located outside of the display area DA.

The touch driving circuit 210 can generate touch sensing data by driving and sensing the touch sensor. The touch driving circuit 210 can supply the generated touch sensing data to the touch controller 220.

The touch controller 220 can detect the presence or absence of a touch or the location (or coordinates) of the touch based on the touch sensing data. The touch controller 220 or any one or more other controllers interworking therewith can perform a predefined function (e.g., input processing, object selection processing, handwriting processing, etc.) based on the detected presence of the touch or the determined location of the touch.

The touch driving circuit 210 can be implemented, for example, in a separate integrated circuit different from the data driving circuit 120. In another example, the touch driving circuit 210 and the data driving circuit 120 can be integrated into a single integrated circuit.

The touch controller 220 can be implemented separately from the display controller 140 or integrated with the display controller 140.

The touch sensing system of the touch display device 100 according to aspects of the present disclosure can detect a touch based on a self-capacitance or a mutual-capacitance.

Hereinafter, example structures of the touch sensor are briefly described with reference to FIGS. 3A and 3B.

Figure 3A:
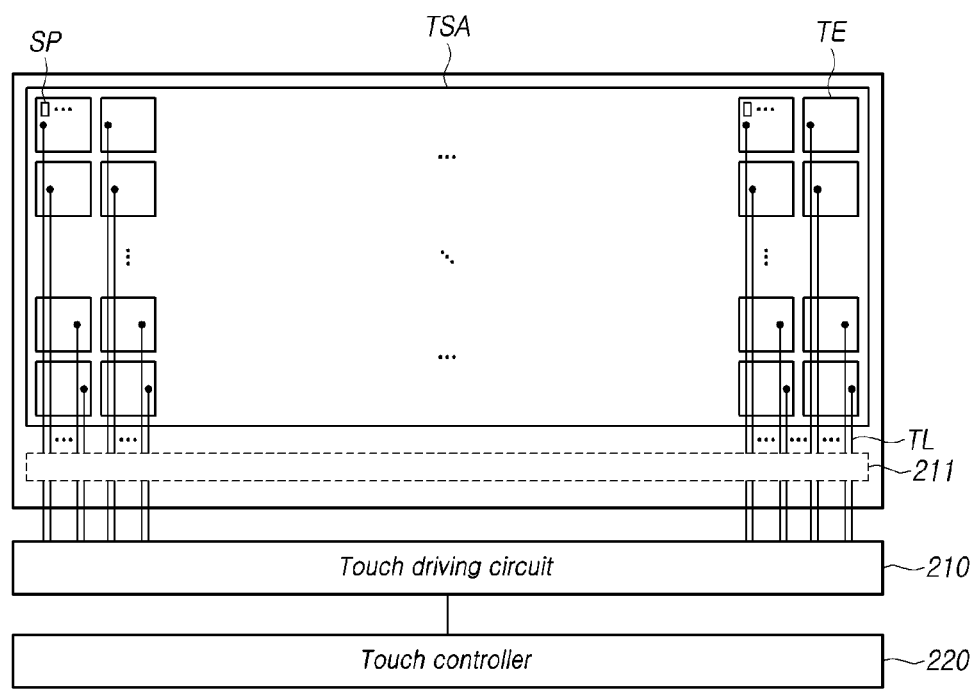
FIG. 3A illustrates a touch sensor structure based on self-capacitance sensing in the touch display device according to aspects of the present disclosure.

FIG. 3A illustrates a touch sensor structure based on self-capacitance sensing in the touch display device 100 according to aspects of the present disclosure.

Referring to FIG. 3A, the touch sensor structure based on self-capacitance sensing employed in the touch display device 100 according to aspects of the present disclosure can include a plurality of touch electrodes TE disposed in the touch sensing area TSA.

Referring to FIG. 3A, in the touch sensor structure based on self-capacitance sensing, the plurality of touch electrodes TE can be disposed to be separated from each other in the touch sensing area TSA.

The touch sensor structure based on self-capacitance sensing can further include a plurality of touch lines TL for electrically connecting each of the plurality of touch electrodes TE to the touch driving circuit 160. The touch lines TL can be referred to as touch routing lines.

In the touch sensor based on self-capacitance sensing, each of the plurality of touch electrodes TE may not electrically intersect one another. In the touch sensor based on self-capacitance sensing, each of the plurality of touch electrodes TE can be one touch node corresponding to touch coordinates.

In examples where the touch display device 100 is configured to detect a touch based on self-capacitance, the touch driving circuit 160 can supply a touch driving signal to at least one of the plurality of touch electrodes TE and sense the touch electrode TE to which the touch driving signal is supplied.

A value of obtained by sensing the touch electrode TE to which the touch driving signal is supplied can be a capacitance, or a value corresponding to the capacitance, in the touch electrode TE to which the touch driving signal is supplied. The capacitance at the touch electrode TE to which the touch driving signal is supplied can be a capacitance between the touch electrode TE to which the touch driving signal is supplied and a touch pointer or object such as a finger, a pen, or the like.

Figure 3B:
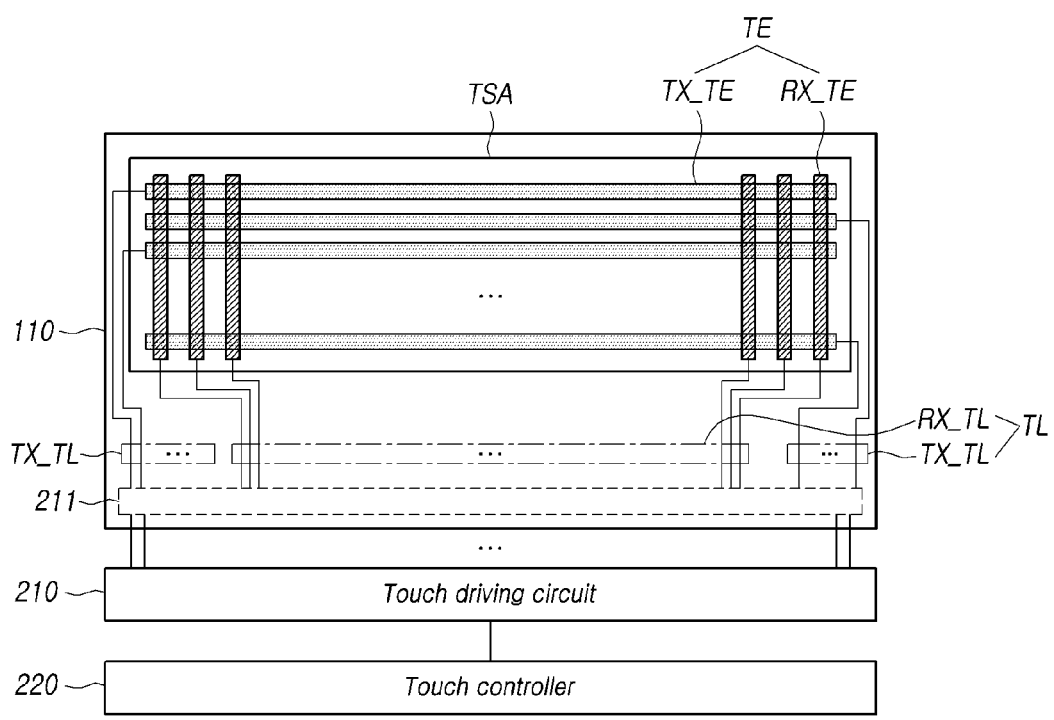
FIG. 3B illustrates a touch sensor structure based on mutual-capacitance sensing in the touch display device according to aspects of the present disclosure.

FIG. 3B illustrates a touch sensor structure based on mutual-capacitance sensing in the touch display device 100 according to aspects of the present disclosure.

The touch sensor structure based on mutual-capacitance sensing of FIG. 3B illustrates an example structure inclusively representing various types of touch sensor structures based on mutual-capacitance sensing, and thus, can be variously modified.

Referring to FIG. 3B, the touch sensor structure based on mutual-capacitance sensing employed in the touch display device 100 according to aspects of the present disclosure can include a plurality of touch electrodes TE. The plurality of touch electrodes TE can include a plurality of transmission touch electrodes TX_TE and a plurality of reception touch electrodes RX_TE.

For example, the plurality of transmission touch electrodes TX_TE and the plurality of reception touch electrodes RX_TE can intersect each other. In another example, the plurality of transmission touch electrodes TX_TE and the plurality of reception touch electrodes RX_TE can be disposed adjacent to each other without intersecting each other such that respective one side of each of the plurality of transmission touch electrodes TX_TE is located adjacent to respective one side of each of the plurality of reception touch electrodes RX_TE.

In another example, the plurality of transmission touch electrodes TX_TE and the plurality of reception touch electrodes RX_TE can overlap each other vertically. In another example, each of the plurality of reception touch electrodes RX_TE can be disposed on respective one side of each of the plurality of transmission touch electrodes TX_TE.

Mutual-capacitance can be formed at points where each transmission touch electrode TX_TE and each reception touch electrode RX_TE intersect or one or more points adjacent to the points where each transmission touch electrode TX_TE and each reception touch electrode RX_TE intersect. A point where one transmission touch electrode TX_TE and one reception touch electrode RX_TE intersect or one or more points adjacent to the point where one transmission touch electrode TX_TE and one reception touch electrode RX_TE intersect can be referred to as a touch node.

Each of the plurality of reception touch electrodes RX_TE can form mutual-capacitances with the plurality of transmission touch electrodes TX_TE, or the plurality of reception touch electrodes RX_TE can form mutual-capacitances with the plurality of transmission touch electrodes TX_TE, respectively. At least one of the mutual-capacitances can vary according to the presence or absence of a touch at a location where the at least one the mutual-capacitance is caused.

Referring to FIG. 3B, in some embodiments, the touch sensor structure of the touch display device 100 can further include a plurality of touch lines TL.

The plurality of touch lines TL can include a plurality of transmission touch lines TX_TL for electrically connecting the plurality of transmission touch electrodes TX_TE to the touch pad unit 211, and a plurality of reception touch lines RX TL for electrically connecting the plurality of reception touch electrodes RX_TE to the touch pad unit 211.

The plurality of transmission touch lines TX_TL can be electrically connected to the touch driving circuit 210 electrically connected to the touch pad unit 211 through the touch pad unit 211. The plurality of reception touch lines RX TL can be electrically connected to the touch driving circuit 210 electrically connected to the touch pad unit 211 through the touch pad unit 211.

The touch driving circuit 210 can supply a touch driving signal to at least one of the plurality of transmission touch electrodes TX_TE and sense at least one of the plurality of reception touch electrodes RX_TE. The plurality of transmission touch electrodes TX_TE can be referred to as driving touch electrodes, and the plurality of reception touch electrodes RX_TE can be referred to as sensing touch electrodes.

For example, referring to the example shown in FIG. 3B, each of the plurality of transmission touch electrodes TX_TE can be disposed to extend in the row direction (e.g., the X-axis direction or the horizontal direction), and each of the plurality of reception touch electrodes RX_TE can be disposed to extend in the column direction (e.g., the Y-axis direction or the vertical direction).

In another example, each of the plurality of transmission touch electrodes TX_TE can be disposed to extend in the column direction (e.g., the Y-axis direction or the vertical direction), and each of the plurality of reception touch electrodes RX_TE can be disposed to extend in the row direction (e.g., the X-axis direction or the horizontal direction).

For convenience of description, as illustrated in FIG. 3B, in discussions that follow, it is assumed that each of the plurality of transmission touch electrodes TX_TE is disposed to extend in the row direction (e.g., the X-axis direction or the horizontal direction), and each of the plurality of reception touch electrodes RX_TE is disposed to extend in the column direction (e.g., the Y-axis direction or the vertical direction). However, embodiments of the present disclosure are not limited thereto.

Each of the plurality of transmission touch electrodes TX_TE can be formed with one touch sensor metal as shown in FIG. 3B. For example, one transmission touch electrode TX_TE formed with one touch sensor metal can have a bar shape as illustrated in FIG. 3B, or can include first portions each having a relatively large area (e.g., a rhombic shape), and one or more second portions each having a relatively small area for connecting the first portions.

Each of the plurality of transmission touch electrodes TX_TE can be formed with two or more metals located in different layers from one another. For example, one transmission touch electrode TX_TE formed with two metals can include first partial electrodes each having a relatively large area (e.g., a rhombic shape), and one or more second partial electrodes each having a relatively small area for connecting the first partial electrodes. The first partial electrodes can be formed with a touch sensor metal, and the one or more second partial electrodes can be formed with a bridge metal. The touch sensor metal and the bridge metal can be located in different layers between which an interlayer insulating film is interposed.

Each of the plurality of reception touch electrodes RX_TE can be formed with one touch sensor metal as shown in FIG. 3B. For example, one reception touch electrode RX_TE formed with one touch sensor metal can have a bar shape as illustrated in FIG. 3B, or can include first portions each having a relatively large area (e.g., a rhombic shape), and one or more second portions each having a relatively small area for connecting the first portions.

Each of the plurality of reception touch electrodes RX_TE can be formed with two or more metals located in different layers from one another. For example, one reception touch electrode RX_TE formed with two metals can include first partial electrodes each having a relatively large area (e.g., a rhombic shape), and one or more second partial electrodes each having a relatively small area for connecting the first partial electrodes. The first partial electrodes can be formed with a touch sensor metal, and the one or more second partial electrodes can be formed with a bridge metal. The touch sensor metal and the bridge metal can be located in different layers between which an interlayer insulating film is interposed.

The plurality of transmission touch electrodes TX_TE and the plurality of reception touch electrodes RX_TE can be disposed in the same layer or can be disposed on different layers.

The plurality of touch lines TL can be formed with at least one of the touch sensor metal and the bridge metal, or can be formed with a third metal different from the touch sensor metal and the bridge metal.

Figure 4A:
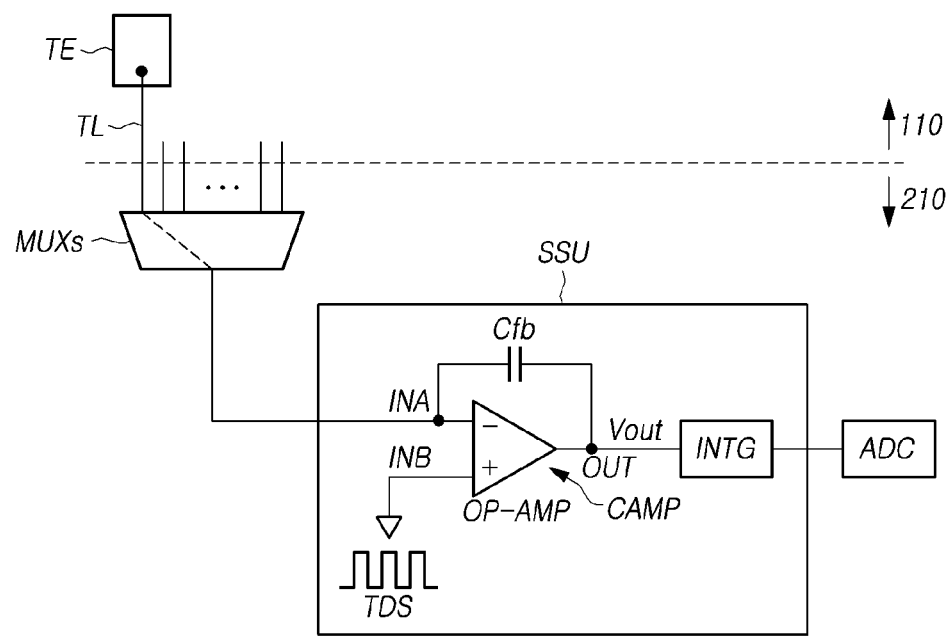
FIG. 4A illustrates a touch driving circuit operating in the touch sensor structure based on self-capacitance sensing in the touch display device according to aspects of the present disclosure.

FIG. 4A illustrates a touch driving circuit 210 operating in the touch sensor structure based on self-capacitance sensing in the touch display device 100 according to aspects of the present disclosure.

Referring to FIG. 4A, the touch driving circuit 210 can include one or more self-sensing units SSUs and one or more analog-to-digital converters ADC.

The self-sensing unit SSU can detect a signal corresponding to a capacitance with respect to a touch electrode TE by driving the touch electrode TE and sensing the touch electrode TE. The self-sensing unit SSU can include a charge amplifier CAMP, an integrator INTG, and the like. The integrator INTG can be included in the charge amplifier CAMP or can be omitted.

The charge amplifier CAMP can include an operational amplifier OP-AMP including a first input node INA electrically connected to a touch line TL, a second input node INB to which a touch driving signal TDS is input, and an output node OUT for outputting an output signal Vout, and a feedback capacitor Cfb between the first input node INA and the output node OUT of the operational amplifier OP-AMP.

The touch driving signal TDS input to the second input node INB can be output to the touch line TL through the first input node INA. For example, the touch driving signal TDS can have voltage levels varying over time, and swing with a predefined frequency and a predefined amplitude. The touch driving signal TDS can have various signal waveforms such as a square wave, a sine wave, a triangular wave, or the like.

The touch driving circuit 210 can further include one or more self-multiplexers MUXs for selecting one of a plurality of touch lines TL and connecting the selected touch line TL to the self-sensing unit SSU.

According to a touch input from a user, a capacitance (self-capacitance) can be formed between the touch pointer of the user (e.g., a finger, a pen, or the like) and an adjacent touch electrode TE. Charge corresponding to the capacitance can move into the first input node INA of the charge amplifier CAMP through the touch line TL. Charges moving into the first input node INA of the charge amplifier CAMP can be stored in the feedback capacitor Cfb of the charge amplifier CAMP.

The charge amplifier CAMP can output a voltage corresponding to the amount of charge stored in the feedback capacitor Cfb as an output signal Vout through the output node OUT.

The integrator INTG can integrate the output signal Vout of the charge amplifier CAMP for a predefined number of times and output a value resulting from the integrating.

The analog-to-digital converter ADC can convert the signal (the value resulting from the integrating) output from the integrator INTG into a sensing value in the form of digital value. The touch driving circuit 210 can output sensing values converted by the analog-to-digital converter (ADC) as sensing data by using a communication module.

The second input node INB of the operational amplifier OP-AMP of the charge amplifier CAMP, to which the touch driving signal TDS is input, can be electrically connected to a reference voltage line RVL used for display driving in the display mode. In this case, the touch driving signal TDS can be used as a reference voltage Vref used while the touch display device 100 operates for display driving. The reference voltage Vref can be a voltage applied to the second node N2 of the driving transistor DRT of the sub-pixel SP (as described with reference to FIG. 1).

Figure 4B:
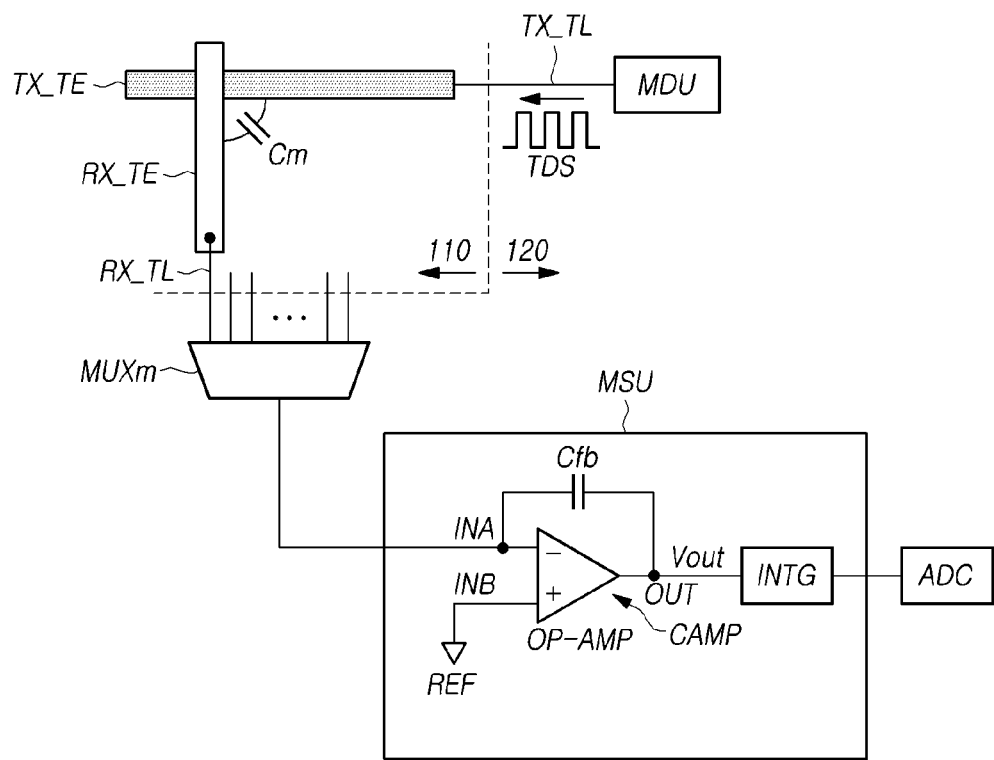
FIG. 4B illustrates a touch driving circuit operating in the touch sensor structure based on mutual-capacitance sensing in the touch display device according to aspects of the present disclosure.

FIG. 4B illustrates the touch driving circuit 210 operating in the touch sensor structure based on mutual-capacitance sensing in the touch display device 100 according to aspects of the present disclosure.

Referring to FIG. 4B, the touch driving circuit 210 can include a mutual-driving unit MDU for driving one or more transmission touch electrodes TX_TE and a mutual-sensing unit MSU for sensing one or more reception touch electrodes RX_TE.

The mutual-driving unit MDU can supply a touch driving signal TDS to a transmission touch electrode TX_TE through a transmission touch line TX_TL. For example, the touch driving signal TDS can have voltage levels varying over time, and swing with a predefined frequency and a predefined amplitude. The touch driving signal TDS can have various signal waveforms such as a square wave, a sine wave, a triangular wave, or the like.

The mutual-sensing unit MSU can detect a signal corresponding to a capacitance (mutual-capacitance) between a reception touch electrode RX_TE and the transmission touch electrode TX_TE through a reception touch line RX TL.

The mutual-sensing unit MSU can include a charge amplifier CAMP, an integrator INTG, and the like. The integrator INTG can be included in the charge amplifier CAMP or can be omitted.

The charge amplifier CAMP can include an operational amplifier OP-AMP including a first input node INA electrically connected to a reception touch line RX TL, a second input node INB to which a reference voltage REF is input, and an output node OUT for outputting an output signal Vout, and a feedback capacitor Cfb between the first input node INA and the output node OUT of the operational amplifier OP-AMP.

The touch driving circuit 210 can further include one or more mutual-multiplexers MUXs for selecting one of a plurality of reception touch lines RX TL and connecting the selected reception touch line RX TL to the mutual-sensing unit MSU.

According to a touch input from a user, a capacitance (mutual-capacitance) can be formed between a transmission touch electrode TX_TE and a reception touch line RX TL that are located at, or adjacent to, a touch pointer of the user (e.g., a finger, a pen, or the like). Charge corresponding to the capacitance can move into the first input node INA of the charge amplifier CAMP through the reception touch line RX TL. Charges moving into the first input node INA of the charge amplifier CAMP can be stored in the feedback capacitor Cfb of the charge amplifier CAMP.

The charge amplifier CAMP can output a voltage corresponding to the amount of charge stored in the feedback capacitor Cfb as an output signal Vout through the output node OUT.

The integrator INTG can integrate the output signal Vout of the charge amplifier CAMP for a predefined number of times and output a value resulting from the integrating.

The analog-to-digital converter ADC can convert the signal (the value resulting from the integrating) output from the integrator INTG into a sensing value in the form of digital value. The touch driving circuit 210 can output sensing values converted by the analog-to-digital converter (ADC) as sensing data by using a communication module.

According to the touch sensor structure based on self-capacitance sensing of FIG. 3A and the touch sensor structure based on mutual-capacitance sensing of FIG. 3B, the number of touch lines TL can be required at least as many as the number of touch electrodes because one touch line TL is required for each touch electrode TE.

Accordingly, according to the touch sensor structure based on self-capacitance sensing of FIG. 3A and the touch sensor structure based on mutual-capacitance sensing of FIG. 3B, the number of touch pads in the touch pad unit 211 can be also required as many as the number of touch lines.

Accordingly, according to the touch sensor structure based on self-capacitance sensing of FIG. 3A and the touch sensor structure based on mutual-capacitance sensing of FIG. 3B, the number of channels (the number of touch channels) of the touch driving circuit 210 can be also required at least as many as the number of touch electrodes.

In an example where the touch display device 100 is designed to have a large size or an increased touch sensing resolution, the number of touch electrodes in the touch display device 100 can increase. In this example, the number of touch lines, the number of touch pads, and the number of channels can considerably increase as well.

To address these issues, the touch display device 100 according to aspects of the present disclosure includes advanced touch sensor structures capable of reducing the number of channels even when the number of touch electrodes increases. Here, the number of channels can mean all, or one or more, of the number of touch lines, the number of touch pads, and the number of touch channels.

The touch display device 100 according to aspects of the present disclosure can provide advantages of reducing the number of touch lines, the number of touch pads, and the number of touch channels, as well as providing an improved touch resolution using an increased number of touch electrodes, by applying the advanced touch sensor structures. Here, the touch resolution can be defined as representing the accuracy of touch sensing. The touch resolution can mean a factor for accurately distinguishing two different touch points. In an implementation where the touch display device has a low touch resolution, the touch display device can determine two different touch points to have the same touch coordinates. In another implementation where the touch display device has a high touch resolution, the touch display device can accurately distinguish two different touch points, and as a result, accurately determine different touch coordinates from each other.

In some embodiments, the advanced touch sensor structures applied to the touch display device 100 can include advanced touch sensor structures based on self-capacitance sensing and advanced touch sensor structures based on mutual-capacitance sensing.

Hereinafter, the advanced touch sensor structures based on self-capacitance sensing in the touch display device 100 according to aspects of the present disclosure will be described with reference to FIGS. 5A, 5B, 6A, 6B, 7A, and 7B. Thereafter, the advanced touch sensor structures based on mutual-capacitance sensing in the touch display device 100 according to aspects of the present disclosure will be described with reference to FIGS. 8A and 8B.

Figure 5A:
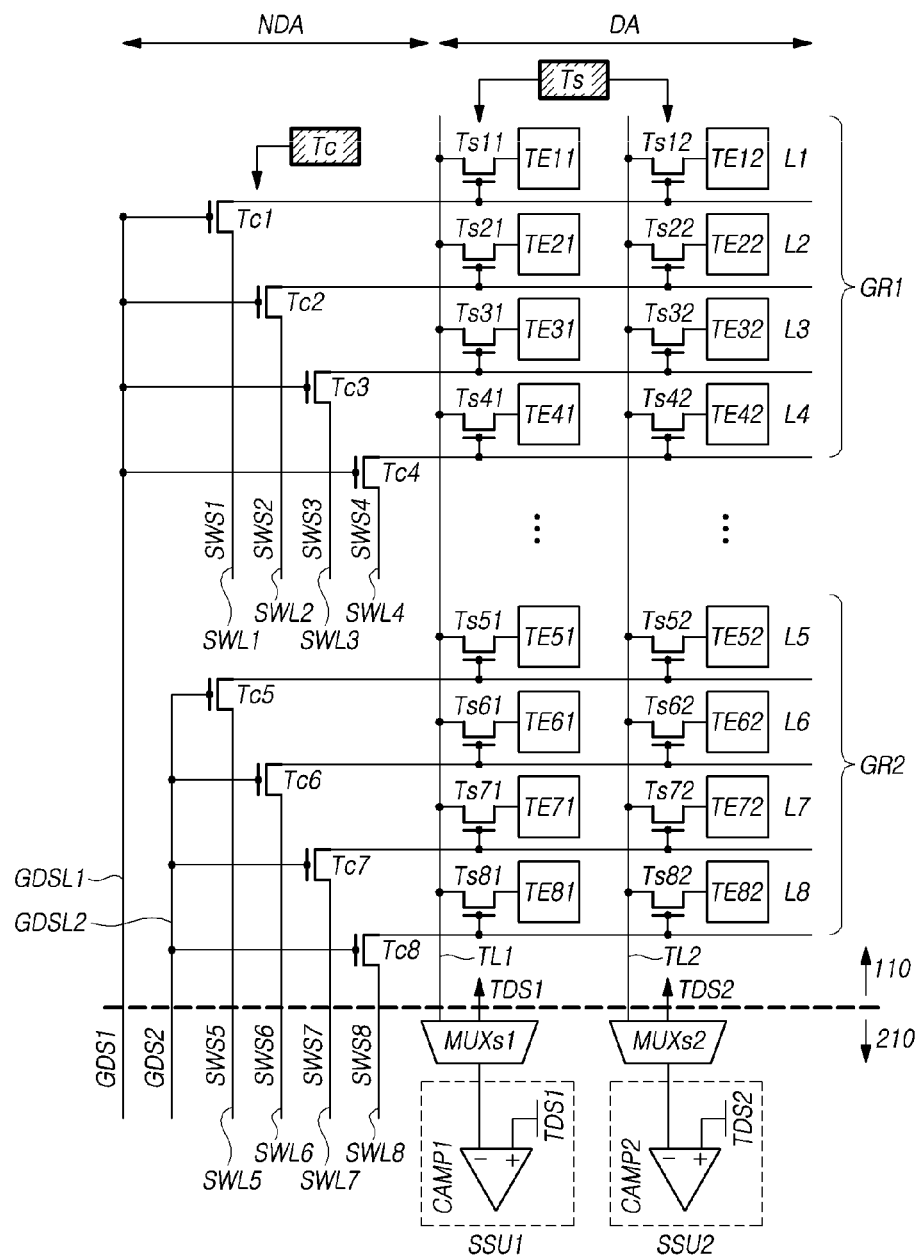
FIGS. 5A and 5B illustrate advanced touch sensor structures based on self-capacitance sensing in the touch display device according to aspects of the present disclosure.
Figure 11:
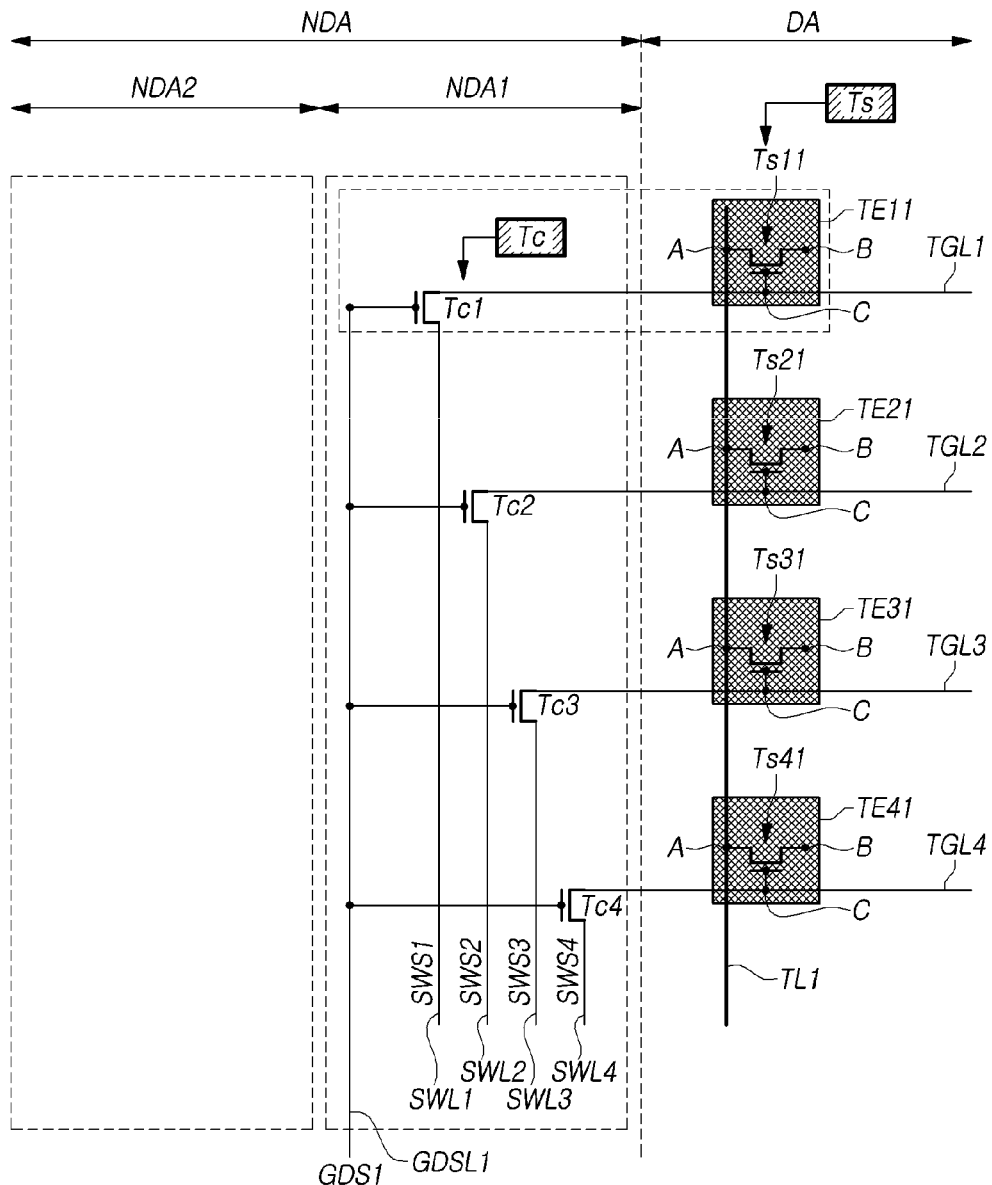
FIG. 11 illustrates first to fourth touch electrodes, first to fourth touch driving transistors, and first to fourth control transistors in the touch display device according to aspects of the present disclosure.

The touch display device 100 according to aspects of the present disclosure can include a controlling circuit which can include a touch gate line (TGL1 and so on, as shown in FIG. 11), a switching signal line (SWL1 and so on, as shown in FIG. 5A), a control transistor (Tc and so on, as shown in FIG. 5A), a group driving signal line (GDSL1 and so on, as shown in FIG. 5A) and a touch driving circuit 210 and so on. The touch display device 100 can be disposed to supplying touch driving signal to a plurality of touch electrode through one touch line, thereby reducing the number of touch lines, the number of touch pads, and the number of channels.

Figure 5B:
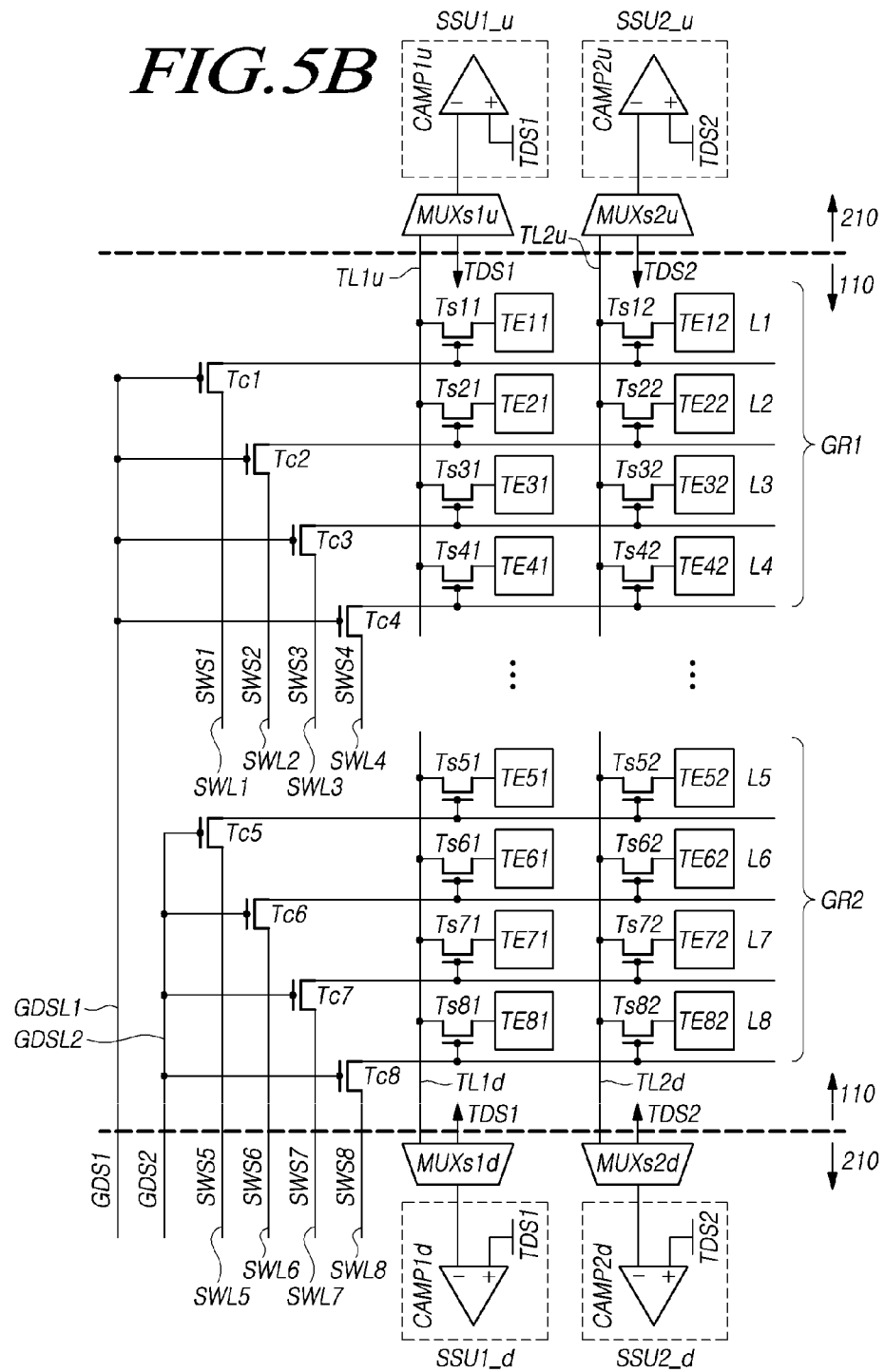
Figure 6A:
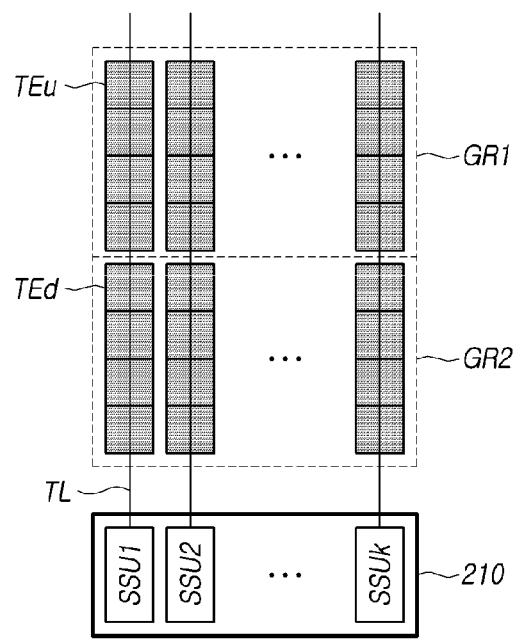
FIGS. 6A and 6B illustrate two schemes for connecting touch electrodes and the touch driving circuit in the advanced touch sensor structures based on self-capacitance sensing in the touch display device according to aspects of the present disclosure.
Figure 6B:
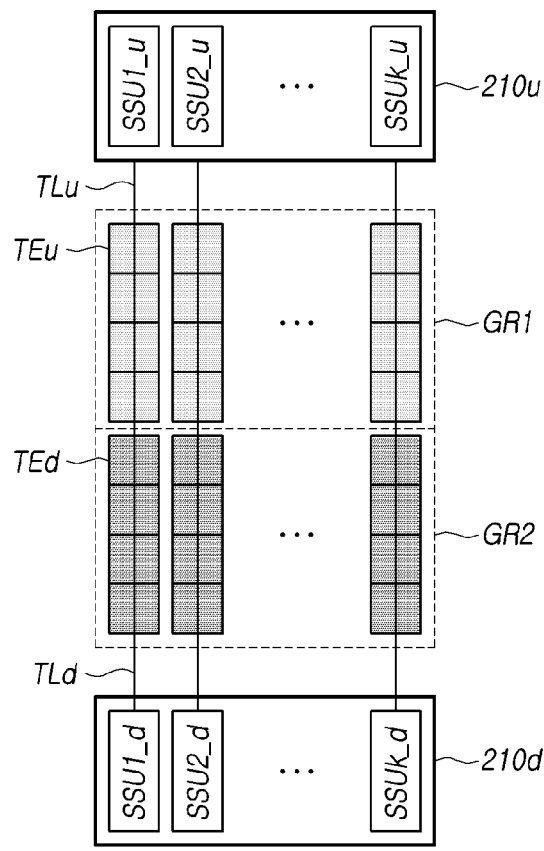

FIGS. 5A and 5B illustrate the advanced touch sensor structures based on self-capacitance sensing of the touch display device 100 according to aspects of the present disclosure. FIGS. 6A and 6B illustrate two schemes of connecting touch electrodes TE and the touch driving circuit 210 in the advanced touch sensor structures based on self-capacitance sensing of the touch display device 100 according to aspects of the present disclosure.

Referring to FIGS. 5A and 5B, the advanced touch sensor structures based on self-capacitance sensing of the touch display device 100 according to aspects of the present disclosure can include a plurality of touch electrodes TE and a plurality of touch driving transistors Ts.

In some embodiments, the advanced touch sensor structures based on self-capacitance sensing of the touch display device 100 can further include a plurality of touch lines TL.

The plurality of touch driving transistors Ts can be connected to the plurality of touch electrodes TE, respectively. For example, the plurality of touch driving transistors Ts can correspond to the plurality of touch electrodes TE on a one-to-one basis. Each of the plurality of touch lines TL can be connected to two or more touch electrodes TE through two or more touch driving transistors Ts.

The plurality of touch electrodes TE can include first to eighth touch electrode rows L1 to L8.

A first touch electrode row L1 can include a plurality of first touch electrodes (TE11, TE12); a second touch electrode row L2 can include a plurality of second touch electrodes (TE21, TE22); a third touch electrode row L3 can include a plurality of third touch electrodes (TE31, TE32); a fourth touch electrode row L4 can include a plurality of fourth touch electrodes (TE41, TE42); a fifth touch electrodes row L5 can include a plurality of fifth touch electrodes (TE51, TE52); a sixth touch electrode row L6 can include a plurality of sixth touch electrodes (TE61, TE62); a seventh touch electrode row L7 can include a plurality of seventh touch electrodes (TE71, TE72): and an eighth touch electrode row L8 can include a plurality of eighth touch electrodes (TE81, TE82).

For group driving, the first to fourth touch electrode rows L1 to L4 can be classified into a first touch electrode group GR1, and the fifth to eighth touch electrode rows (L5 to L8) can be classified into a second touch electrode group GR2.

Referring to FIGS. 6A and 6B, the first to fourth touch electrodes (TE11, TE12, TE21, TE22, TE31, TE32, TE41, TE42) included in the first touch electrode group GR1 are referred to as upper touch electrodes TEu, and the fifth to eighth touch electrodes (TE51, TE52, TE61, TE62, TE71, TE72, TE81, TE82) included in the second touch electrode group GR2 are referred to as lower touch electrodes TEd.

Referring to FIGS. 5A and 6A, the touch driving circuit 210 can include a plurality of self-sensing units (SSU1 to SSUk, where k is a natural number equal to or greater than 2). The plurality of self-sensing units SSU1 to SSUk can be located in one side or edge of the display panel 110. For example, the plurality of self-sensing units SSU1 to SSUk can be connected to the touch pad unit 211 located in the non-display area NDA relatively closer to the second touch electrode group GR2 than to the first touch electrode group GR1.

The plurality of self-sensing units SSU1 to SSUk can sense both the first touch electrode group GR1 and the second touch electrode group GR2. For example, the plurality of self-sensing units SSU1 to SSUk can sense both the upper touch electrodes TEu and the lower touch electrodes TEd.

Eight touch electrodes (TE11, TE21, TE31, TE41, TE51, TE61, TE71 and TE81) disposed in the first column in the first touch electrode group GR1 and the second touch electrode group GR2 can correspond to one first touch line TL1 of the plurality of touch lines TL.

The eighth touch electrodes (TE11, TE21, TE31, TE41, TE51, TE61, TE71 and TE81) disposed in the first column can be connected to one first touch line TL1 of the plurality of touch lines TL through eight touch driving transistors (Ts11, Ts21, Ts31, Ts41, Ts51, Ts61, Ts71, and Ts81), respectively.

Accordingly, the number of touch lines, the number of touch pads, and the number of channels can be significantly reduced because only one first touch line TL1 is disposed for the eight touch electrodes (TE11, TE21, TE31, TE41, TE51, TE61, TE71 and TE81) disposed in the first column.

Further, referring to FIGS. 5A and 6A, eight touch electrodes (TE12, TE22, TE32, TE42, TE52, TE62, TE72 and TE82) disposed in the second column in the first touch electrode group GR1 and the second touch electrode group GR2 can correspond to one second touch line TL2 of the plurality of touch lines TL.

The eight touch electrodes (TE12, TE22, TE32, TE42, TE52, TE62, TE72 and TE82) disposed in the second column can be connected to one second touch line TL2 of the plurality of touch lines TL through eight touch driving transistors (Ts12, Ts22, Ts32, Ts42, Ts52, Ts62, Ts72, and Ts82), respectively.

Accordingly, the number of touch lines, the number of touch pads, and the number of channels can be significantly reduced because only one second touch line TL2 is disposed for the eight touch electrodes (TE12, TE22, TE32, TE42, TE52, TE62, TE72 and TE82) disposed in the first column.

Referring to FIGS. 5B and 6B, the touch driving circuit 210 can include a plurality of upper self-sensing units (SSU1_u to SSUk_u, k is a natural number equal to or greater than 2) and a plurality of lower self-sensing units (SSU1_d to SSUk_d, k is a natural number equal to or greater than 2).

The plurality of upper self-sensing units SSU1_u to SSUk_u can be located in one side or edge of the display panel 110. The plurality of lower self-sensing units SSU1_d to SSUk_d can be located in the other side or edge of the display panel 110. For example, the plurality of upper self-sensing units SSU1_u to SSUk_u can be connected to the touch pad unit 211 located in the non-display area NDA relatively closer to the first touch electrode group GR1 than to the second touch electrode group GR2. The plurality of lower self-sensing units SSU1_d to SSUk_d can be connected to the touch pad unit 211 located in the non-display area NDA relatively closer to the second touch electrode group GR2 than to the first touch electrode group GR1.

The plurality of upper self-sensing units SSU1_u to SSUk_u can sense the first touch electrode group GR1. For example, the plurality of upper self-sensing units SSU1_u to SSUk_u can sense the upper touch electrodes TEu. The plurality of lower self-sensing units SSU1_d to SSUk_d can sense the second touch electrode group GR2. For example, the plurality of lower self-sensing units SSU1_d to SSUk_d can sense the lower touch electrodes TEd.

Four upper touch electrodes (TE11, TE21, TE31, and TE41) disposed in the first column in the first touch electrode group GR1 can correspond to one first upper touch line TL1u of the plurality of upper touch lines TLu. Four lower touch electrodes (TE51, TE61, TE71, and TE81) disposed in the first column in the second touch electrode group GR2 can correspond to one first lower touch line TL1d of the plurality of lower touch lines TLu.

The four upper touch electrodes (TE11, TE21, TE31, and TE41) disposed in the first column can be connected to the one first upper touch line TL1u through four touch driving transistors (Ts11, Ts21, Ts31 and Ts41), respectively. The four lower touch electrodes (TE51, TE61, TE71, and TE81) disposed in the first column can be connected to the one first lower touch line TL1d through four touch driving transistors (Ts51, Ts61, Ts71 and Ts81).

Accordingly, the number of touch lines, the number of touch pads, and the number of channels can be significantly reduced because only one first upper touch line TL1u is disposed for the four upper touch electrodes (TE11, TE21, TE31 and TE41) disposed in the first column. Further, the number of touch lines, the number of touch pads, and the number of channels can be significantly reduced because only one first lower touch line TL1d is disposed for the four lower touch electrodes (TE51, TE61, TE71 and TE81) disposed in the first column.

Further, referring to FIGS. 5B and 6B, four upper touch electrodes (TE12, TE22, TE32, and TE42) disposed in the second column in the first touch electrode group GR1 can correspond to one second upper touch line TL2u of the plurality of upper touch lines TLu. Four lower touch electrodes (TE52, TE62, TE72, and TE82) disposed in the second column in the second touch electrode group GR2 can correspond to one second lower touch line TL2d of the plurality of lower touch lines TLu.

The four upper touch electrodes (TE12, TE22, TE32, and TE42) disposed in the second column can be connected to the one second upper touch line TL2u through four touch driving transistors (Ts12, Ts22, Ts32 and Ts42), respectively. The four lower touch electrodes (TE52, TE62, TE72, and TE82) disposed in the second column can be connected to the one second lower touch line TL2d through four touch driving transistors (Ts52, Ts62, Ts72 and Ts82), respectively.

Accordingly, the number of touch lines, the number of touch pads, and the number of channels can be significantly reduced because only one second upper touch line TL2u is disposed for the four upper touch electrodes (TE12, TE22, TE32 and TE42) disposed in the second column. Further, the number of touch lines, the number of touch pads, and the number of channels can be significantly reduced because only one second lower touch line TL2d is disposed for the four lower touch electrodes (TE52, TE62, TE72 and TE82) disposed in the second column.

The above-described structure can be briefly described as follows. The advanced touch sensor structure based on self-capacitance according to embodiments of the present disclosure can include the first touch electrode TE11 and the second touch electrode TE21, which are spaced apart from each other, and the first touch line TL1 to which a touch driving signal TDS1 is applied.

The advanced touch sensor structure based on self-capacitance according to embodiments of the present disclosure can include the first touch driving transistor Ts11 for controlling a connection between the first touch electrode TE11 and the first touch line TL1, and the second touch driving transistor Ts21 for controlling a connection between the second touch electrode TE21 and the first touch line TL1.

The advanced touch sensor structure based on self-capacitance according to embodiments of the present disclosure can further include the third touch electrode TE31 and the fourth touch electrode TE41, which are spaced apart from each other, and further include the third touch driving transistor Ts31 for controlling a connection between the third touch electrode TE31 and the first touch line TL1, and the fourth touch driving transistor Ts41 for controlling a connection between the fourth touch electrode TE41 and the first touch line TL1.

Referring to FIGS. 5A, 5B, 6A, and 6B, as the first touch driving transistor Ts11 is turned on, a first touch driving signal TDS1 can be supplied to the first touch electrode TE11 through the first touch line TL1 or the first upper touch line TL1u. As the second touch driving transistor Ts21 is turned on, the first touch driving signal TDS1 can be supplied to the second touch electrode TE21 through the first touch line TL1 or the first upper touch line TL1u.

As the third touch driving transistor Ts31 is turned on, the first touch driving signal TDS1 can be supplied to the third touch electrode TE31 through the first touch line TL1 or the first upper touch line TL1u. As the fourth touch driving transistor Ts41 is turned on, the first touch driving signal TDS1 can be supplied to the fourth touch electrode TE41 through the first touch line TL1 or the first upper touch line TL1u.

Referring to FIGS. 5A and 6A, the first self-sensing unit SSU1 included in the touch driving circuit 210 can be electrically connected to the first touch line TL1 through a first self-multiplexer MUXs1. The first self-sensing unit SSU1 can include a first charge amplifier CAMP1 for receiving a first touch driving signal TD and outputting the received first touch driving signal TDS1 to the first touch line TL1 through the first self-multiplexer MUXs1.

The second self-sensing unit SSU2 included in the touch driving circuit 210 can be electrically connected to the second touch line TL2 through a second self-multiplexer MUXs2. The second self-sensing unit SSU2 can include a second charge amplifier CAMP2 for receiving a second touch driving signal TDS2 and outputting the received second touch driving signal TDS2 to the second touch line TL2 through the second self-multiplexer MUXs2.

Referring to FIGS. 5B and 6B, a first upper self-sensing unit SSU1_u included in the touch driving circuit 210 can be electrically connected to the first upper touch line TL1u through a first upper self-multiplexer MUXs1u. The first upper self-sensing unit SSU1_u can include a first upper charge amplifier CAMP1u for receiving a first touch driving signal TDS1 and outputting the received first touch driving signal TDS1 to the first upper touch line TL1u through the first upper self-multiplexer MUXs1u.

A first lower self-sensing unit SSU1_d included in the touch driving circuit 210 can be electrically connected to the first lower touch line TL1d through a first lower self-multiplexer MUXs1d. The first lower self-sensing unit SSU1_d can include a first lower charge amplifier CAMP1d for receiving the first touch driving signal TDS1 and outputting the received first touch driving signal TDS1 to the first lower touch line TL1d through the first lower self-multiplexer MUXs1d.

A second upper self-sensing unit SSU2_u included in the touch driving circuit 210 can be electrically connected to the second upper touch line TL2u through a second upper self-multiplexer MUXs2u. The second upper self-sensing unit SSU2_u can include a second upper charge amplifier CAMP2u for receiving a second touch driving signal TDS2 and outputting the received second touch driving signal TDS2 to the second upper touch line TL2u through the second upper self-multiplexer MUXs2u.

A second lower self-sensing unit SSU2_d included in the touch driving circuit 210 can be electrically connected to the second lower touch line TL2d through a second lower self-multiplexer MUXs2d. The second lower self-sensing unit SSU2_d can include a second lower charge amplifier CAMP2d for receiving the second touch driving signal TDS2 and outputting the received second touch driving signal TDS2 to the second lower touch line TL2d through the second lower self-multiplexer MUXs2d.

The touch driving transistors Ts including the first touch driving transistor Ts11 and the second touch driving transistor Ts21 can be located in the touch sensing area TSA.

The touch driving transistors Ts including the first touch driving transistor Ts11 and the second touch driving transistor Ts21 can be located in the display area DA of the display panel 110.

Referring to FIGS. 5A and 5B, in some embodiments, the advanced touch sensor structure based on self-capacitance sensing can further include control transistors Tc for controlling the turn-on or turn-off of touch driving transistors Ts.

The control transistors Tc can include first to eighth control transistors Tc1 to Tc8. The first to eighth control transistors Tc1 to Tc8 can correspond to the first to eighth touch electrode rows L1 to L8 on a one-to-one basis.

In some embodiments, the advanced touch sensor structure based on self-capacitance sensing can further include switching signal lines SWL1 to SWL8 for suppling switching signals SWS1 to SWS8 applied to the gate nodes of the touch driving transistors Ts.

The switching signal lines SWL1 to SWL8 can include first to eighth switching signal lines SWL1 to SWL8.

The first switching signal line SWL1 can deliver a first switching signal SW for turning on one or more first touch driving transistors Ts11 and Ts12 corresponding to the first touch electrode row L1.

The second switching signal line SWL2 can deliver a second switching signal SWS2 for turning on all of one or more second touch driving transistors Ts21 and Ts22 corresponding to the second touch electrode row L2.

The third switching signal line SWL3 can deliver a third switching signal SWS3 for turning on all of one or more third touch driving transistors Ts31 and Ts32 corresponding to the third touch electrode row L3.

The fourth switching signal line SWL4 can deliver a fourth switching signal SWS4 for turning on all of one or more fourth touch driving transistors Ts41 and Ts42 corresponding to the fourth touch electrode row L4.

The fifth switching signal line SWL5 can deliver a fifth switching signal SWS5 for turning on all of one or more fifth touch driving transistors Ts51 and Ts52 corresponding to the fifth touch electrode row L5.

The sixth switching signal line SWL6 can deliver a sixth switching signal SWS6 for turning on all of one or more sixth touch driving transistors Ts61 and Ts62 corresponding to the sixth touch electrode row L6.

The seventh switching signal line SWL7 can deliver a seventh switching signal SWS7 for turning on all of one or more seventh touch driving transistors Ts71 and Ts72 corresponding to the seventh touch electrode row L7.

The eighth switching signal line SWL8 can deliver an eighth switching signal SWS8 for turning on all of one or more eighth touch driving transistors Ts81 and Ts82 corresponding to the eighth touch electrode row L8.

The first control transistor Tc1 can commonly control connections between the first switching signal line SWL1 and respective one or more gate nodes of one or more first touch driving transistors Ts11 and Ts12 corresponding to the first touch electrode row L1.

The second control transistor Tc2 can commonly control connections between the second switching signal line SWL2 and respective one or more gate nodes of one or more second touch driving transistors Ts21 and Ts22 corresponding to the second touch electrode row L2.

The third control transistor Tc3 can commonly control connections between the third switching signal line SWL3 and respective one or more gate nodes of one or more third touch driving transistors Ts31 and Ts32 corresponding to the third touch electrode row L3.

The fourth control transistor Tc4 can commonly control connections between the fourth switching signal line SWL4 and respective one or more gate nodes of one or more fourth touch driving transistors Ts41 and Ts42 corresponding to the fourth touch electrode row L4.

The fifth control transistor Tc5 can commonly control connections between the fifth switching signal line SWL5 and respective one or more gate nodes of one or more fifth touch driving transistors Ts51 and Ts52 corresponding to the fifth touch electrode row L5.

The sixth control transistor Tc6 can commonly control connections between the sixth switching signal line SWL6 and respective one or more gate nodes of one or more sixth touch driving transistors Ts61 and Ts62 corresponding to the sixth touch electrode row L6.

The seventh control transistor Tc7 can commonly control connections between the seventh switching signal line SWL7 and respective one or more gate nodes of one or more seventh touch driving transistors Ts71 and Ts72 corresponding to the seventh touch electrode row L7.

The eighth control transistor Tc8 can commonly control connections between the eighth switching signal line SWL8 and respective one or more gate nodes of one or more eighth touch driving transistors Ts81 and Ts82 corresponding to the eighth touch electrode row L8.

Referring to FIGS. 5A and 5B, the first to eighth control transistors Tc1 to Tc8 can be classified into the first to fourth control transistors Tc1 to Tc4 corresponding to the first touch electrode group GR1 and the fifth to eighth control transistors Tc5 to Tc8 corresponding to the second touch electrode group GR2.

In some embodiments, the advanced touch sensor structure based on self-capacitance sensing can include a first group driving signal line GDSL1 to which the gate nodes of the first to fourth control transistors Tc1 to Tc4 are commonly connected, and a second group driving signal line GDSL2 to which the gate nodes of the fifth to eighth control transistors Tc5 to Tc8 are commonly connected.

The first group driving signal line GDSL1 can commonly supply a first group driving signal GDS1 to the gate nodes of the first to fourth control transistors Tc1 to Tc4.

The second group driving signal line GDSL2 can commonly supply a second group driving signal GDS2 to the gate nodes of the fifth to eighth control transistors Tc5 to Tc8.

Referring to FIGS. 5A and 5B, the touch electrodes (TE11, TE12, TE21, TE22, TE31, TE32, TE41, TE42, TE51, TE52, TE61, TE62, TE71, TE72, TE81, TE82), the touch lines (TL1, TL2), the touch driving transistors Ts, and the control transistors Tc can be included in the display panel 110.

The display panel 110 can include the display area DA for displaying an image and the non-display area NDA located outside of the display area DA.

The touch electrodes (TE11, TE12, TE21, TE22, TE31, TE32, TE41, TE42, TE51, TE52, TE61, TE62, TE71, TE72, TE81, TE82), the touch lines (TL1, TL2), and the touch driving transistors Ts can be disposed in the display area DA of the display panel 110. The control transistors Tc can be disposed in the non-display area NDA of the display panel 110.

The fifth touch driving transistor Ts51 can control a connection between the fifth touch electrode TE51 and the first touch line (TL1, TL1u). As the fifth touch driving transistor Ts51 is turned on, the first touch driving signal TDS1 can be supplied to the fifth touch electrode TE51 through the first touch line (TL1, TL1u).

The sixth touch driving transistor Ts61 can control a connection between the sixth touch electrode TE61 and the first touch line (TL1, TL1u). As the sixth touch driving transistor Ts61 is turned on, the first touch driving signal TDS1 can be supplied to the sixth touch electrode TE61 through the first touch line (TL1, TL1u).

The seventh touch driving transistor Ts71 can control a connection between the seventh touch electrode TE71 and the first touch line (TL1, TL1u). As the seventh touch driving transistor Ts71 is turned on, the first touch driving signal TDS1 can be supplied to the seventh touch electrode TE71 through the first touch line (TL1, TL1u).

The eighth touch driving transistor Ts81 can control a connection between the eighth touch electrode TE81 and the first touch line (TL1, TL1u). As the eighth touch driving transistor Ts81 is turned on, the first touch driving signal TDS1 can be supplied to the eighth touch electrode TE81 through the first touch line (TL1, TL1u).

Referring to FIG. 5B, the fifth touch driving transistor Ts51 can control a connection between the fifth touch electrode TE51 and the second touch line TL1d. As the fifth touch driving transistor Ts51 is turned on, the first touch driving signal TDS1 can be supplied to the fifth touch electrode TE51 through the second touch line TL1d.

The sixth touch driving transistor Ts61 can control a connection between the sixth touch electrode TE61 and the second touch line TL1d. As the sixth touch driving transistor Ts61 is turned on, the first touch driving signal TDS1 can be supplied to the sixth touch electrode TE61 through the second touch line TL1d.

The seventh touch driving transistor Ts71 can control a connection between the seventh touch electrode TE71 and the second touch line TL1d. As the seventh touch driving transistor Ts71 is turned on, the first touch driving signal TDS1 can be supplied to the seventh touch electrode TE71 through the second touch line TL1d.

The eighth touch driving transistor Ts81 can control a connection between the eighth touch electrode TE81 and the second touch line TL1d. As the eighth touch driving transistor Ts81 is turned on, the first touch driving signal TDS1 can be supplied to the eighth touch electrode TE81 through the second touch line TL1d.

Figure 7A:
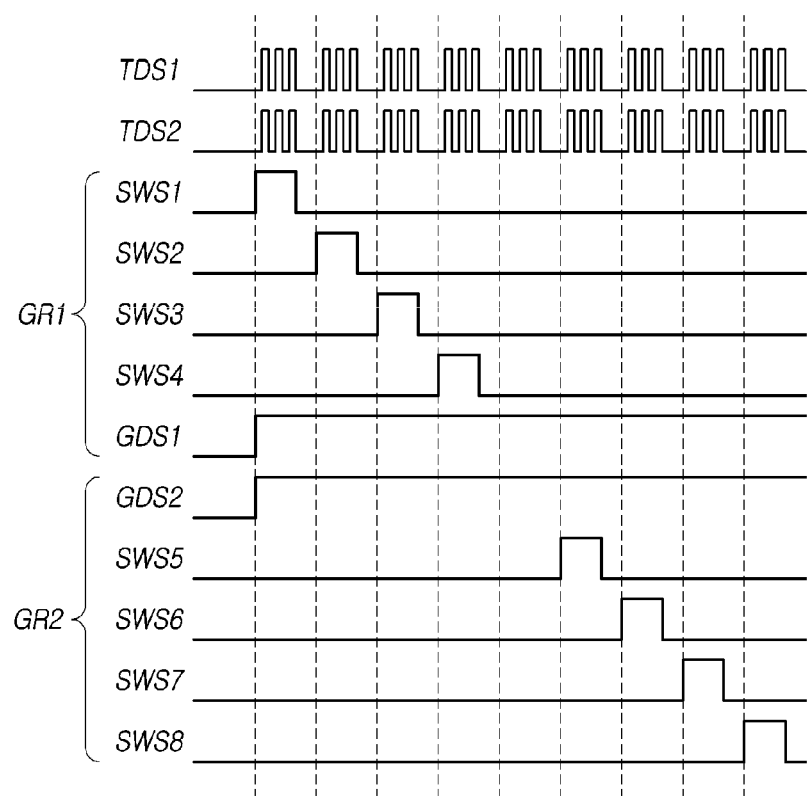
FIGS. 7A and 7B are a touch driving timing diagram of an individual driving scheme and a touch driving timing diagram of a group driving scheme, in the advanced touch sensor structures based on self-capacitance sensing in the touch display device according to aspects of the present disclosure.
Figure 7B:
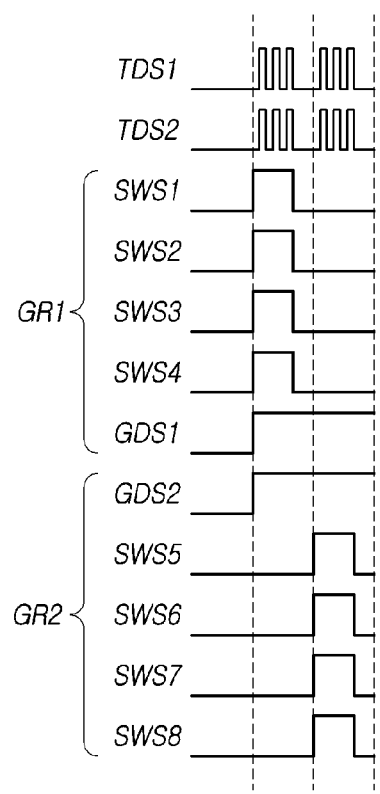

FIGS. 7A and 7B are a touch driving timing diagram of an individual driving scheme and a touch driving timing diagram of a group driving scheme, in the advanced touch sensor structures based on self-capacitance sensing in the touch display device 100 according to aspects of the present disclosure. Hereinafter, for convenience of description, discussions are conducted with respect to the eight touch electrodes (TE11, TE21, TE31, TE41, TE51, TE61, TE71, and TE81) disposed in the first column.

Referring to FIG. 7A, the touch display device 100 according to aspects of the present disclosure can drive the first to eighth touch electrode rows L1 to L8 individually and sequentially. This driving scheme can be referred to as an individual driving scheme, a sequential driving scheme, or an individual sequential driving scheme.

According to the individual driving scheme, the first to eighth touch driving transistors Ts11 to Ts81 can be sequentially turned on.

The first scheme for sequentially turning on the first to eighth touch driving transistors Ts11 to Ts81 is implemented such that in a situation where all of the first to eighth control transistors Tc1 to Tc8 are simultaneously turned on, respective turn-on level voltage durations of the first to eighth switching signals SWS1 to SWS8 supplied to the gate nodes of the first to eighth touch driving transistors Ts11 to Ts81 through the first to eighth control transistors Tc1 to Tc8 that have been turned on are sequentially controlled.

According to the first scheme, to simultaneously turn on the first to eighth control transistors Tc1 to Tc8, a first group drive signal GDS1 having a turn-on level voltage (e.g., a high level voltage) can be simultaneously applied to the gate nodes of the first to fourth control transistors Tc1 to Tc4, and a second group driving signal GDS2 having a turn-on level voltage (e.g. a high level voltage) can be simultaneously applied to the gate nodes of the fifth to eighth control transistors Tc5 to Tc8.

According to the first scheme, while the first to eighth control transistors Tc1 to Tc8 are simultaneously turned on, the first to eighth switching signals SWS1 to SWS8 can have sequentially respective turn-on level voltages.

Accordingly, the first to eighth touch driving transistors Ts11 to Ts81 can be sequentially turned on, and pulses included in the first touch driving signal TDS can be sequentially supplied to the first to eighth touch electrodes (TE11, TE21, and TE31, TE41, TE51, TE61, TE71, and TE81).

The second scheme for sequentially turning on the first to eighth touch driving transistors Ts11 to Ts81 is implemented such that during a period in which the first and second group driving signals GDS1 and GDS2 have respective turn-on level voltages, the first to eighth switching signals SWS1 to SWS8 are controlled to continually have respective turn-on level voltages, and the first to eighth control transistors Tc1 to Tc8 are controlled to be sequentially turned on.

According to the second scheme, while the first to eighth switching signals SWS1 to SWS8 simultaneously have respective turn-on level voltages, the first to eighth control transistors Tc1 to Tc8 can be sequentially turned on.

Referring to FIG. 7B, the touch display device 100 according to aspects of the present disclosure can simultaneously drive the first to fourth touch electrode rows L1 to L4 included in the first touch electrode group GR1, and simultaneously drive the fifth to eighth touch electrode rows L5 to L8 included in the second touch electrode group GR2. This driving scheme can be referred to as a group driving scheme.

According to the group driving scheme, the first touch electrode group GR1 can be simultaneously driven, and the second touch electrode group GR2 can be simultaneously driven. For example, after the first touch electrode group GR1 is driven, the second touch electrode group GR2 can be driven.

According to the group driving scheme, the first to fourth touch driving transistors Ts11 to Ts41 corresponding to the first touch electrode group GR1 can be simultaneously turned on. The fifth to eighth touch driving transistors Ts51 to Ts81 corresponding to the second touch electrode group GR2 can be simultaneously turned on.

While the first to fourth control transistors Tc1 to Tc4 corresponding to the first touch electrode group GR1 are simultaneously turned on by the first group driving signal GDS1, the first to fourth switching signals SWS1 to SWS4 can have respective turn-on level voltages at the same time or in the same time period.

While the fifth to eighth control transistors Tc4 to Tc8 corresponding to the second touch electrode group GR2 are simultaneously turned on by the second group driving signal GDS2, the fifth to eighth switching signals SWS5 to SWS8 can have respective turn-on level voltages at the same time or in the same time period.

While the first to fourth switching signals SWS1 to SWS4 have respective turn-on level voltages at the same time or in the same time period, the first to fourth control transistors Tc1 to Tc4 to corresponding to the first touch electrode group GR1 can be turned on at the same time or in the same time period.

While the fifth to eighth switching signals SWS5 to SWS8 simultaneously have respective turn-on level voltages at the same time or in the same time period, the fifth to eighth control transistors Tc4 to Tc8 corresponding to the second touch electrode group GR2 can be turned on at the same time or in the same time period.

Figure 8A:
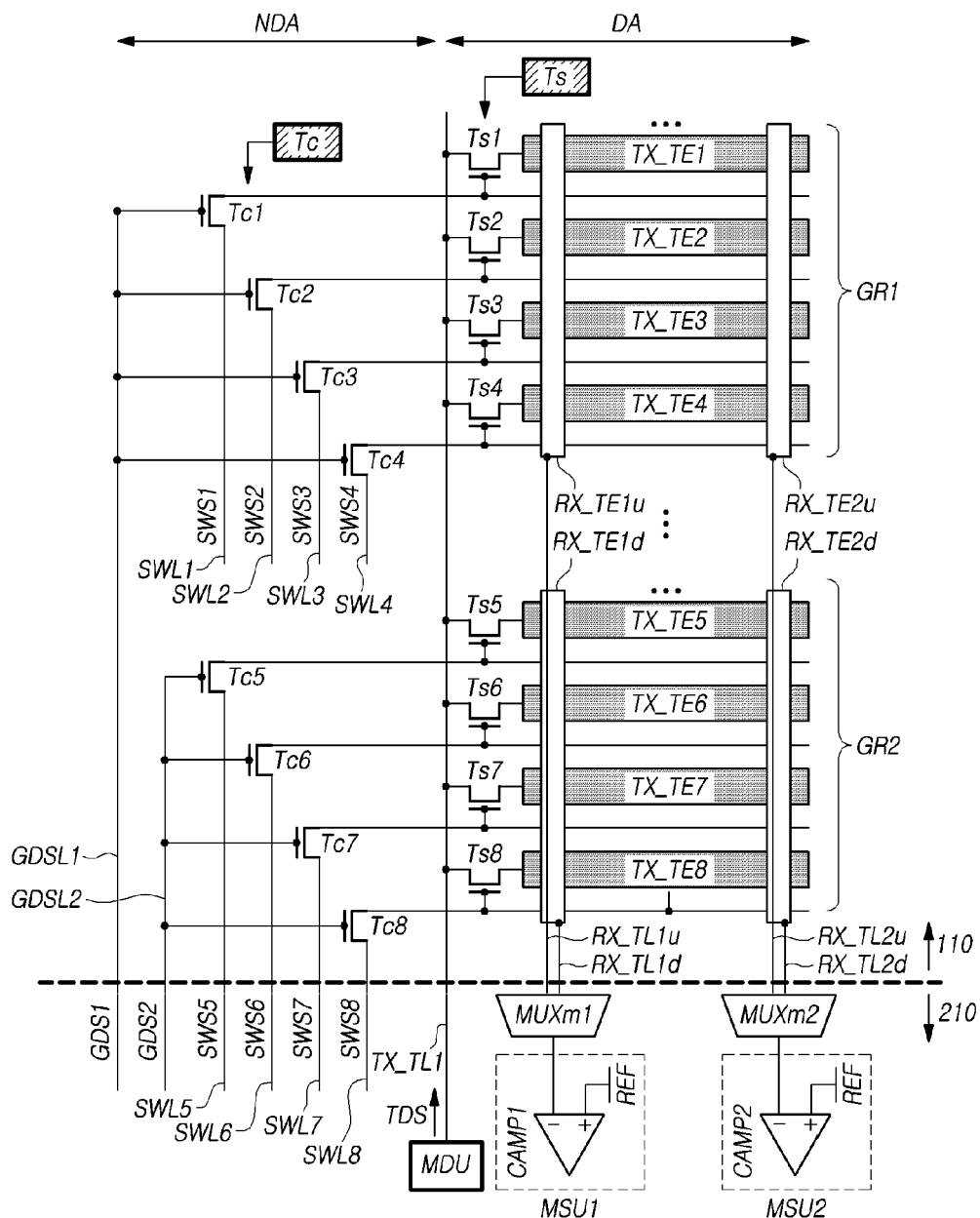
FIGS. 8A and 8B illustrate advanced touch sensor structures based on mutual-capacitance sensing in the touch display device according to aspects of the present disclosure.
Figure 8B:
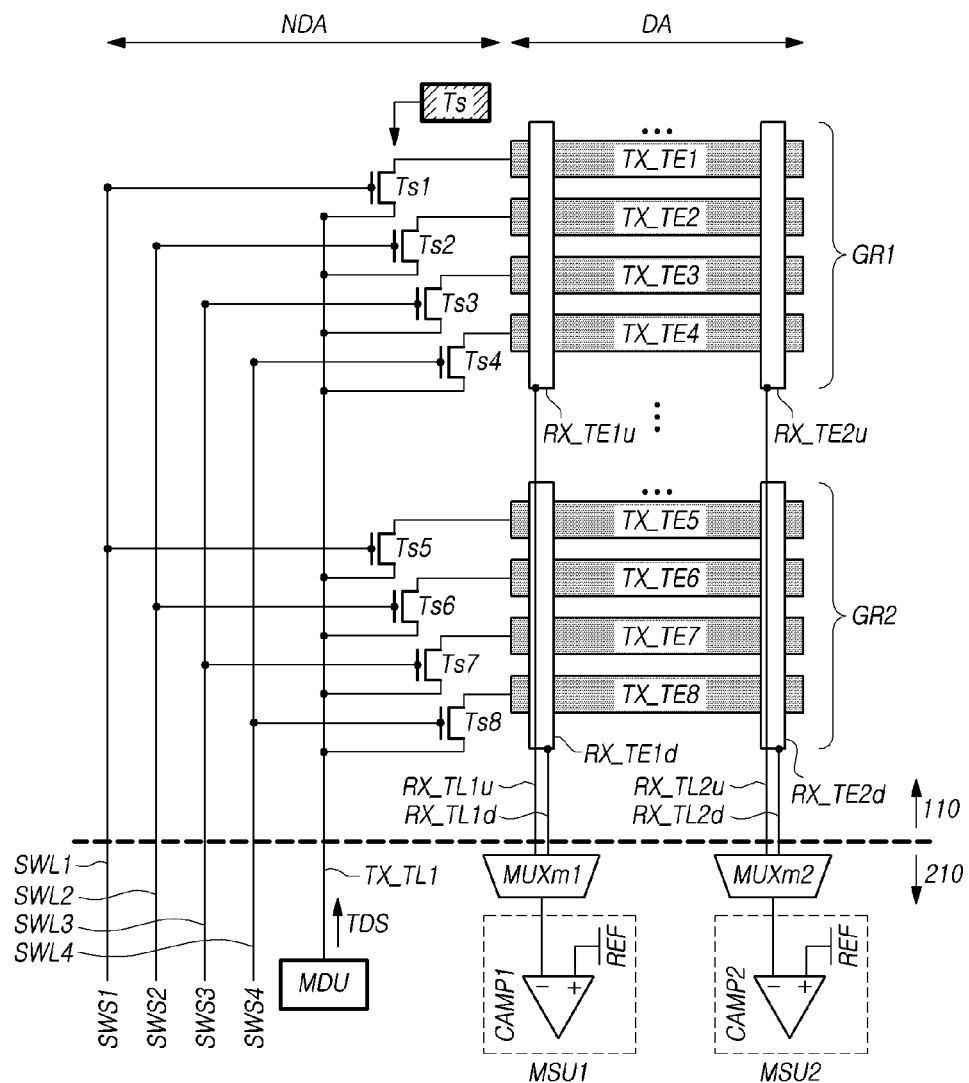

FIGS. 8A and 8B illustrate advanced touch sensor structures based on mutual-capacitance sensing in the touch display device 100 according to aspects of the present disclosure. First to eighth transmission touch electrodes TX_TE1 to TX_TE8 mentioned below can also be referred to as first to eighth touch electrodes. A first transmission touch line TX_TL1 can also be referred to as a first touch line TL1.

Referring to FIGS. 8A and 8B, in some embodiments, the advanced touch sensor structures based on mutual-capacitance sensing of the touch display device 100 can include a plurality of transmission touch electrodes TX_TE1 to TX_TE8 and a plurality of reception touch electrodes (RX_TE1u, RX_TE1d, RX TE2u, RX TE2d). For example, the plurality of transmission touch electrodes TX_TE1 to TX_TE8 and the plurality of reception touch electrodes (RX TE2u, RX TE2d) can intersect each other.

In some embodiments, the advanced touch sensor structures based on mutual-capacitance sensing of the touch display device 100 can include a plurality of touch driving transistors Ts corresponding to the plurality of transmission touch electrodes TX_TE1 to TX_TE8 on a one-to-one basis. The plurality of touch driving transistors Ts can include first to eighth touch driving transistors Ts1 to Ts8.

The first to eighth touch driving transistors Ts1 to Ts8 can control respective connections between one first transmission touch line TX_TL1 and the first to eighth transmission touch electrodes TX_TE1 to TX_TE8.

In some embodiments, the advanced touch sensor structures based on mutual-capacitance sensing of the touch display device 100 can include a plurality of touch lines (TX_TL1, RX TL1u, RX TL1d, RX_TL2u, RX_TL2d).

The first to eighth transmission touch electrodes TX_TE1 to TX_TE8 can be connected to the one first transmission touch line TX_TL1 through the respective first to eighth touch driving transistors Ts1 to Ts8. Accordingly, the number of touch lines, the number of touch pads, and the number of transmission channels can be significantly reduced.

The first transmission touch line TX_TL1 can supply a touch driving signal TDS output from a mutual-driving unit MDU to the first to eighth transmission touch electrodes TX_TE1~TX_TE8 through the respective first to eighth touch driving transistors Ts1 to Ts8.

A first upper reception touch line RX TL1u can electrically connect a first upper reception touch electrode RX_TE1u and a first mutual-sensing unit MSU1. A first lower reception touch line RX TL1d can electrically connect a first lower reception touch electrode RX_TE1d and the first mutual-sensing unit MSU1.

The first upper reception touch line RX TL1u and the first lower reception touch line RX TL1d can be connected to the first mutual-sensing unit MSU1 through a first mutual multiplexer MUXm1. The first mutual multiplexer MUXm1 can select one of the first upper reception touch line RX TL1u and the first lower reception touch line RX TL1d and connect the selected reception touch line to the first mutual-sensing unit MSU1.

A second upper reception touch line RX_TL2u can electrically connect a second upper reception touch electrode RX_TE1u and a second mutual-sensing unit MSU2. A second lower reception touch line RX_TL2d can electrically connect a second lower reception touch electrode RX_TE1d and the second mutual-sensing unit MSU2.

The second upper reception touch line RX_TL2u and the second lower reception touch line RX_TL2d can be connected to the second mutual-sensing unit MSU2 through a second mutual multiplexer MUXm2. The second mutual multiplexer MUXm2 can select one of the second upper reception touch line RX_TL2u and the second lower reception touch line RX_TL2d and connect the selected reception touch line to the second mutual-sensing unit MSU2.

Referring to FIGS. 8A and 8B, the first to eighth transmission touch electrodes TX_TE1 to TX_TE8 can be classified into two touch electrode groups GR1 and GR2. The first touch electrode group GR1 can include the first to fourth transmission touch electrodes TX_TE1 to TX_TE4, and the second touch electrode group GR2 can include the fifth to eighth transmission touch electrodes TX_TE5 to TX_TE8.

In some embodiments, the advanced touch sensor structure based on mutual-capacitance sensing can include switching signal lines for suppling switching signals applied to the gate nodes of the touch driving transistors Ts.

In some embodiments, in the advanced touch sensor structure based on mutual-capacitance sensing of FIG. 8A, switching signal lines can include first to eighth switching signal lines SWL1 to SWL8.

In the advanced touch sensor structure based on mutual-capacitance sensing of FIG. 8A, the first switching signal line SWL1 can deliver a first switching signal SWS1 for turning on the first touch driving transistor Ts1. The second switching signal line SWL2 can deliver a second switching signal SWS2 for turning on the second touch driving transistor Ts2. The third switching signal line SWL3 can deliver a third switching signal SWS3 for turning on the third touch driving transistor Ts3. The fourth switching signal line SWL4 can deliver a fourth switching signal SWS4 for turning on the fourth touch driving transistor Ts4. The fifth switching signal line SWL5 can deliver a fifth switching signal SWS5 for turning on the fifth touch driving transistor Ts5. The sixth switching signal line SWL6 can deliver a sixth switching signal SWS6 for turning on the sixth touch driving transistor Ts6. The seventh switching signal line SWL7 can deliver a seventh switching signal SWS7 for turning on the seventh touch driving transistor Ts7. The eighth switching signal line SWL8 can deliver an eighth switching signal SWS8 for turning on the eighth touch driving transistor Ts8.

In some embodiments, in the advanced touch sensor structure based on mutual-capacitance sensing of FIG. 8A, the first control transistor Tc1 can control a connection between the first switching signal line SWL1 and the gate node of the first touch driving transistor Ts1. The second control transistor Tc2 can control a connection between the second switching signal line SWL2 and the gate node of the second touch driving transistor Ts2. The third control transistor Tc3 can control a connection between the third switching signal line SWL3 and the gate node of the third touch driving transistor Ts3. The fourth control transistor Tc4 can control a connection between the fourth switching signal line SWL4 and the gate node of the fourth touch driving transistor Ts4. The fifth control transistor Tc5 can control a connection between the fifth switching signal line SWL5 and the gate node of the fifth touch driving transistor Ts5. The sixth control transistor Tc6 can control a connection between the sixth switching signal line SWL6 and the gate node of the sixth touch driving transistor Ts6. The seventh control transistor Tc7 can control a connection between the seventh switching signal line SWL7 and the gate node of the seventh touch driving transistor Ts7. The eighth control transistor Tc8 can control a connection between the eighth switching signal line SWL8 and the gate node of the eighth touch driving transistor Ts8.

Referring to FIG. 8A, in some embodiments, the advanced touch sensor structure based on mutual-capacitance sensing of the touch display device 100 can include a plurality of control transistors Tc for controlling the turn-on or turn-off of the touch driving transistors Ts. The plurality of control transistors Tc can include first to eighth control transistors Tc1 to Tc8.

The first to eighth control transistors Tc1 to Tc8 can be classified into the first to fourth control transistors Tc1 to Tc4 corresponding to the first touch electrode group GR1 and the fifth to eighth control transistors Tc5 to Tc8 corresponding to the second touch electrode group GR2.

In some embodiments, the advanced touch sensor structure based on mutual-capacitance sensing can include a first group driving signal line GDSL1 to which the gate nodes of the first to fourth control transistors Tc1 to Tc4 are commonly connected, and a second group driving signal line GDSL2 to which the gate nodes of the fifth to eighth control transistors Tc5 to Tc8 are commonly connected.

The first group driving signal line GDSL1 can commonly supply a first group driving signal GDS1 to the gate nodes of the first to fourth control transistors Tc1 to Tc4.

The second group driving signal line GDSL2 can commonly supply a second group driving signal GDS2 to the gate nodes of the fifth to eighth control transistors Tc5 to Tc8.

In some embodiments, in the advanced touch sensor structure based on mutual-capacitance sensing of FIG. 8B, switching signal lines can include first to eighth switching signal lines SWL1 to SWL8.

In the advanced touch sensor structure based on mutual-capacitance sensing of FIG. 8B, the first switching signal line SWL1 can deliver a first switching signal SWS1 for turning on the first touch driving transistor Ts1. The second switching signal line SWL2 can deliver a second switching signal SWS2 for turning on the second touch driving transistor Ts2. The third switching signal line SWL3 can deliver a third switching signal SWS3 for turning on the third touch driving transistor Ts3. The fourth switching signal line SWL4 can deliver a fourth switching signal SWS4 for turning on the fourth touch driving transistor Ts4. The fifth switching signal line SWL5 can deliver a fifth switching signal SWS5 for turning on the fifth touch driving transistor Ts5. The sixth switching signal line SWL6 can deliver a sixth switching signal SWS6 for turning on the sixth touch driving transistor Ts6. The seventh switching signal line SWL7 can deliver a seventh switching signal SWS7 for turning on the seventh touch driving transistor Ts7. The eighth switching signal line SWL8 can deliver an eighth switching signal SWS8 for turning on the eighth touch driving transistor Ts8.

In some embodiments, in the advanced touch sensor structure based on mutual-capacitance sensing of FIG. 8B, the first switching signal line SWL1 can be commonly connected to the gate node of the first touch driving transistor Ts1 and the gate node of the fifth touch driving transistor Ts5. The second switching signal line SWL2 can be commonly connected to the gate node of the second touch driving transistor Ts2 and the gate node of the sixth touch driving transistor Ts6. The third switching signal line SWL3 can be commonly connected to the gate node of the third touch driving transistor Ts3 and the gate node of the seventh touch driving transistor Ts7. The fourth switching signal line SWL4 can be commonly connected to the gate node of the fourth touch driving transistor Ts4 and the gate node of the eighth touch driving transistor Ts8.

Referring to FIGS. 8A and 8B, transmission touch electrodes (TX_TE1 to TX_TE8), reception touch electrodes (RX_TE1u, RX_TE1d, RX TE2u, RX TE2d), touch lines (TX_TL1, RX TL1u, RX TL1d, RX_TL2u, RX_TL2d), touch driving transistors Ts, and control transistors Tc can be included in the display panel 110.

The display panel 110 can include the display area DA for displaying an image and the non-display area NDA located outside of the display area DA.

The transmission touch electrodes (TX_TE1 to TX_TE8), the reception touch electrodes (RX_TE1u, RX_TE1d, RX TE2u, RX TE2d), and the touch lines (TX_TL1, RX TL1u, RX TL1d, RX_TL2u, RX_TL2d) can be disposed in the display area DA of the display panel 110. The control transistors Tc can be disposed in the non-display area NDA of the display panel 110. The touch driving transistors Ts can be disposed in the display area DA or the non-display area NDA of the display panel 110.

The first touch driving transistor Ts1 can control a connection between the first transmission touch electrode TX_TE1 and the first transmission touch line TX_TL1. As the first touch driving transistor Ts1 is turned on, a touch driving signal TDS can be supplied to the first transmission touch electrode TX_TE1 through the first transmission touch line TX_TL1.

The second touch driving transistor Ts2 can control a connection between the second transmission touch electrode TX_TE2 and the second transmission touch line TX_TL1. As the second touch driving transistor Ts2 is turned on, the touch driving signal TDS can be supplied to the second transmission touch electrode TX_TE2 through the first transmission touch line TX_TL1.

The third touch driving transistor Ts3 can control a connection between the third transmission touch electrode TX_TE3 and the first transmission touch line TX_TL1. As the third touch driving transistor Ts3 is turned on, the touch driving signal TDS can be supplied to the third transmission touch electrode TX_TE3 through the first transmission touch line TX_TL1.

The fourth touch driving transistor Ts4 can control a connection between the fourth transmission touch electrode TX_TE4 and the first transmission touch line TX_TL1. As the fourth touch driving transistor Ts4 is turned on, the touch driving signal TDS can be supplied to the fourth transmission touch electrode TX_TE4 through the first transmission touch line TX_TL1.

The fifth touch driving transistor Ts5 can control a connection between the fifth transmission touch electrode TX_TE5 and the first transmission touch line TX_TL1. As the fifth touch driving transistor Ts5 is turned on, the touch driving signal TDS can be supplied to the fifth transmission touch electrode TX_TE5 through the first transmission touch line TX_TL1.

The sixth touch driving transistor Ts6 can control a connection between the sixth transmission touch electrode TX_TE6 and the first transmission touch line TX_TL1. As the sixth touch driving transistor Ts6 is turned on, the touch driving signal TDS can be supplied to the sixth transmission touch electrode TX_TE6 through the first transmission touch line TX_TL1.

The seventh touch driving transistor Ts7 can control a connection between the seventh transmission touch electrode TX_TE7 and the first transmission touch line TX_TL1. As the seventh touch driving transistor Ts7 is turned on, the touch driving signal TDS can be supplied to the seventh transmission touch electrode TX_TE7 through the first transmission touch line TX_TL1.

The eighth touch driving transistor Ts8 can control a connection between the eighth transmission touch electrode TX_TE8 and the first transmission touch line TX_TL1. As the eighth touch driving transistor Ts8 is turned on, the touch driving signal TDS can be supplied to the eighth transmission touch electrode TX_TE8 through the first transmission touch line TX_TL1.

In the advanced touch sensor structure based on the mutual-capacitance sensing of FIG. 8B, although the gate nodes of the first to eighth touch driving transistors Ts1 to Ts8 are connected to one first transmission touch line TX_TL1, but in some embodiments, each of the gate nodes of the first to eighth touch driving transistors Ts1 to Ts8 can be connected to a separate, or respective, transmission touch line.

Meanwhile, in some embodiments, the advanced touch sensor structures based on the mutual-capacitance sensing of the touch display device 100 can also be driven by the individual driving scheme as shown in FIG. 7A or by the group driving scheme as shown in FIG. 7B.

Figure 9:
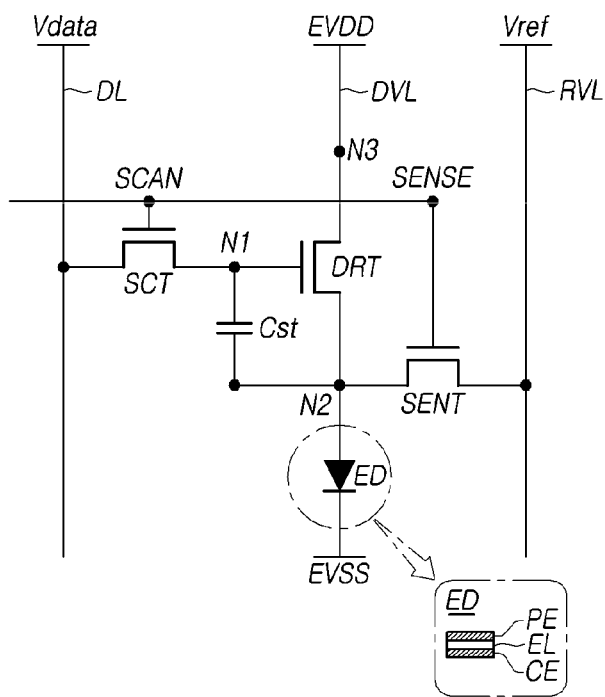
FIG. 9 illustrates an equivalent circuit of a subpixel included in the touch display device according to aspects of the present disclosure.

FIG. 9 illustrates an equivalent circuit of a subpixel included in the touch display device 100 according to aspects of the present disclosure.

Referring to FIG. 9, in some embodiments, each sub-pixel SP of the touch display device 100 can further include a sensing transistor SENT, unlike the equivalent circuit of the sub-pixel SP of FIG. 1.

Accordingly, the sub-pixel SP illustrated in FIG. 9 can include a light emitting element ED, three transistors (DRT, SCT, and SENT), and one storage capacitor Cst.

The turn-on or turn-off of the sensing transistor SENT can be controlled by a sensing signal SENSE supplied from a gate line GL, and thereby, the sensing transistor SENT can control a connection between a second node N2 of the driving transistor DRT and the reference voltage line RVL. Here, the second node N2 of the driving transistor DRT can be electrically connected to the pixel electrode PE of the light emitting element ED.

The sensing transistor SENT can be turned on by the sensing signal SENSE with a turn-on level voltage and apply a reference voltage Vref supplied from the reference voltage line RVL to the second node N2 of the driving transistor DRT.

Each of the driving transistor DRT, the scan transistor SENT, and the sensing transistor SENT can be n-type transistors or p-type transistors. All of the driving transistor DRT, the scan transistor SENT, and the sensing transistor SENT can be n-type transistors or p-type transistors. At least one of the driving transistor DRT, the scan transistor SENT, and the sensing transistor SENT can be n-type transistor(s) (or p-type transistor(s)), and the other can be p-type transistor(s) (or n-type transistor(s)).

As illustrated in FIG. 9, the gate node of each of the scan transistor SCT and the sensing transistor SENT can be connected to a same single gate line GL. In another example, the gate node of each of the scan transistor SCT and the sensing transistor SENT can be connected to different gate lines GL. Hereinafter, for convenience of description, in discussions that follow, it is assumed that the gate node of each of the scan transistor SCT and the sensing transistor SENT is connected to a same single gate line GL.

The structure (3T(three transistors)-1C(one capacitor) of the sub-pixel SP illustrated in FIG. 9 is merely an example for description. In some embodiments, a sub-pixel SP included in the display device 100 can further include one or more transistors or, one or more capacitors, in addition to the 3T-1C structure. In some embodiments, sub-pixels SP included in the display device 100 can have a same structure, or at least one of the sub-pixels SP can have a different structure.

In some embodiments, the touch display device 100 can have a top emission structure or a bottom emission structure.

Hereinafter, the vertical structure of the advanced touch sensor structure of the touch display device 100 according to the embodiments described above will be described in more detail. To do this, corresponding discussions are conducted based on the advanced touch sensor structure based on self-capacitance sensing of FIG. 5A.

Figure 10:
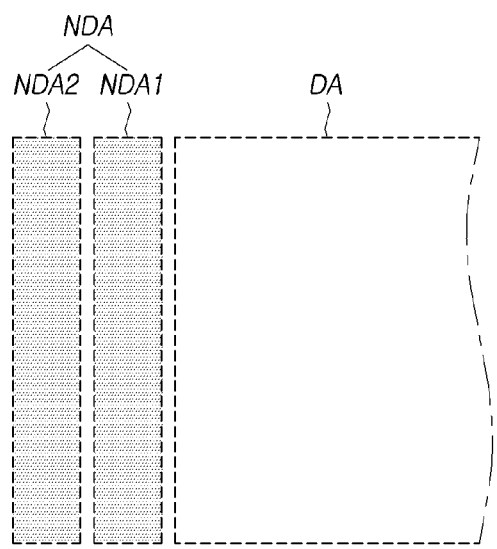
FIG. 10 illustrates a display area and a non-display area in the display panel of the touch display device according to aspects of the present disclosure.

FIG. 10 illustrates the display area and the non-display area in the display panel 110 of the touch display device 100 according to aspects of the present disclosure. FIG. 11 illustrates first to fourth touch electrodes (TE11~TE41), first to fourth touch driving transistors (Ts11~Ts41), and first to fourth control transistors (Tc1~Tc4) in the touch display device 100 according to aspects of the present disclosure. For convenience of description, discussions will be conducted with respect to the first to fourth touch electrodes (TE11, TE21, TE31, and TE41) included in the first touch electrode group GR1.

Referring to FIGS. 10 and 11, the display panel 110 can include the display area DA in which an image is displayed and the non-display area NDA in which an image is not displayed. The non-display area NDA can include a first non-display area NDA1 and a second non-display area NDA2.

Referring to FIG. 11, the first non-display area NDA1 can be an area in which a touch driving related circuit is disposed, and the second non-display area NDA2 can be an area in which a gate driving circuit 130 for displaying an image is disposed.

First to fourth touch electrodes TE11 to TE41 and first to fourth touch driving transistors Ts11 to Ts41 can be disposed to correspond to each other in the display area DA.

The first touch driving transistor Ts11 can be disposed adjacent to the first touch electrode TE11, and include first to third nodes (A, B and C) electrically connected to a first touch line TL1, the first touch electrode TE11, and a first touch gate line TGL1, respectively. The second touch driving transistor Ts21 can be disposed adjacent to the second touch electrode TE21, and include first to third nodes (A, B and C) electrically connected to the first touch line TL1, the second touch electrode TE21, and a second touch gate line TGL2, respectively. The third touch driving transistor Ts31 can be disposed adjacent to the third touch electrode TE31, and include first to third nodes (A, B and C) electrically connected to the first touch line TL1, the third touch electrode TE31, and a third touch gate line TGL3, respectively. The fourth touch driving transistor Ts41 can be disposed adjacent to the fourth touch electrode TE41, and include first to third nodes (A, B and C) electrically connected to the first touch line TL1, the fourth touch electrode TE41, and a fourth touch gate line TGL4, respectively.

The second nodes B of the first to fourth touch driving transistors Ts11 to Ts41 can be electrically connected to the first to fourth touch electrodes TE11 to TE41, respectively, and the third nodes C of the first to fourth touch driving transistors Ts11 to Ts41 can be electrically connected to the first to fourth touch gate lines TGL1 to TGL4, respectively. All the first nodes A of the first to fourth touch driving transistors Ts11 to Ts41 can be connected to the one first touch line TL1.

The first to fourth touch driving transistors Ts11 to Ts41 can overlap the first to fourth touch electrodes TE11 to TE41, respectively.

The first touch line TL1 can be disposed in the display area DA and can extend to the non-display area NDA to be connected to the touch pad unit 211.

The first to fourth touch gate lines TGL1 to TGL4 can extend from the display area DA to the non-display area NDA such that the first to fourth touch gate lines TGL1 to TGL4 extend up to a portion of the first non-display area NDA1 in which at least one touch driving related circuit is disposed.

First to fourth switching signal lines SWL1 to SWL4 and the first to fourth control transistors Tc1 to Tc4 can be disposed in the first non-display area NDA1.

The turn-on or turn-off of the first to fourth control transistors Tc1 to Tc4 can be simultaneously controlled by a first group driving signal GDS1 supplied through a first group driving signal line GDSL1.

As the first control transistor Tc1 is turned on, the first control transistor Tc1 can output the first switching signal SWS1 supplied from the first switching signal line SWL1 to the first touch gate line TGL1. As the second control transistor Tc2 is turned on, the second control transistor Tc2 can output the second switching signal SWS2 supplied from the second switching signal line SWL2 to the second touch gate line TGL2. As the third control transistor Tc3 is turned on, the third control transistor Tc3 can output the third switching signal SWS3 supplied from the third switching signal line SWL3 to the third touch gate line TGL3. As the fourth control transistor Tc4 is turned on, the fourth control transistor Tc4 can output the fourth switching signal SWS4 supplied from the fourth switching signal line SWL4 to the fourth touch gate line TGL4.

The second non-display area NDA2 can be an area in which a gate driving circuit 130 for displaying an image is disposed. For example, a gate driving transistor Tg for outputting one or more gate signals (a scan signal and/or a sensing signal) to a first gate line GL can be disposed in the second non-display area NDA2. For example, the gate driving transistor Tg can be one of a pull-up transistor and a pull-down transistor as a transistor included in an output buffer circuit for outputting a gate signal to the first gate line GL.

The touch display device 100 according to aspects of the present disclosure can include the substrate SUB including the display area DA and the non-display area NDA, the first and second touch electrodes TE11 and TE21 disposed in the display area DA, the first touch driving transistor Ts11 disposed adjacent to the first touch electrode TE11, the second touch driving transistor Ts21 disposed adjacent to the second touch electrode TE21, the first touch line TL1 electrically connected to the first touch electrode TE11 through the first touch driving transistor Ts11 and electrically connected to the second touch electrode TE21 through the second touch driving transistor Ts21, the first touch gate line TGL1 electrically connected to the gate node C of the first touch driving transistor Ts11, and the second touch gate line TGL2 electrically connected to the gate node C of the second touch driving transistor Ts21.

In some embodiments, the touch display device 100 can further include the first switching signal line SWL1 for delivering a first switching signal SWS1 for turning on the first touch driving transistor Ts11, the second switching signal line SWL2 for delivering a second switching signal SWS2 for turning on the second touch driving transistor Ts21, the first control transistor Tc1 for controlling a connection between the first touch gate line TGL1 and the first switching signal line SWL1, and a second control transistor Tc2 for controlling a connection between the second touch gate line TGL2 and the second switching signal line SWL2.

In some embodiments, the first control transistor Tc1 and the second control transistor Tc2 included in the touch display device 100 can be disposed in the non-display area.

Figure 12:
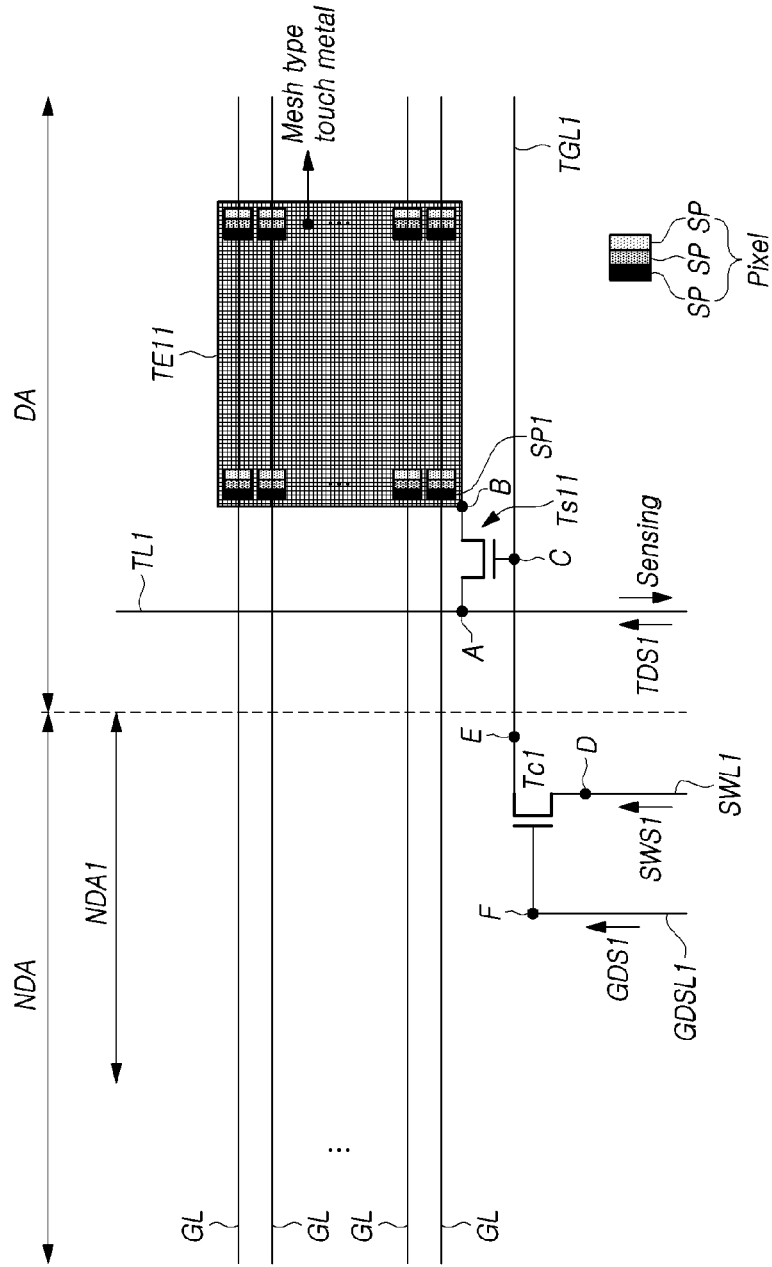
FIG. 12 illustrates the first touch electrode, the first touch driving transistor, and the first control transistor in the touch display device according to aspects of the present disclosure.

FIG. 12 illustrates the first touch electrode TE11, the first touch driving transistor Ts11, and the first control transistor Tc1 in the touch display device 100 according to aspects of the present disclosure. FIG. 12 is an enlarged view of the configuration of a dotted line box 1100 in FIG. 11.

Referring to FIG. 12, in some embodiments, one first touch electrode TE11 disposed in the display area DA in the display panel 110 of the touch display device 100 can overlap two or more sub-pixels SP. Here, the two or more sub-pixels SP can include a first sub-pixel SP1 as in examples discussed below.

One first touch electrode TE11 disposed in the display area DA in the display panel 110 can be formed with a mesh-type touch metal. Accordingly, the first touch electrode TE11 can include two or more openings. Each of the two or more openings can correspond to a light emitting area of at least one sub-pixel SP.

In the display area DA in the display panel 110, the first touch driving transistor Ts11 disposed adjacent to the first touch electrode TE11 can include first to third nodes (A, B, and C) electrically connected to the first touch line TL1, the first touch electrode TE11, and the first touch gate line TGL1, respectively.

A first touch driving signal TD output from the touch driving circuit 210 can be supplied to the first touch line TL1. As the first touch driving transistor Ts11 is turned on, the first touch driving signal TDS1 can be applied to the first touch electrode TE11 through the first touch driving transistor Ts11.

The first control transistor Tc1 can be a transistor for controlling the turn-on or turn-off of the first touch driving transistor Ts11 and be disposed in the first non-display area NDA1 included in the non-display area NDA of the display panel 110.

The first control transistor Tc1 can include first to third nodes (D, E, and F) electrically connected to the first switching signal line SWL1, the first touch gate line TGL1, and the first group driving signal line GDLS1, respectively.

Two or more gate lines GL connected to two or more sub-pixels SP overlapping the first touch electrode TE11 can be disposed in parallel to the first touch gate line TGL1. The first touch line TL1 can be disposed in parallel to two or more data lines DL connected to the two or more sub-pixels SP overlapping the first touch electrode TE11.

Hereinafter, the vertical structure of an area in which a first sub-pixel SP1, the first touch driving transistor Ts11, and the first control transistor Tc1 are formed as illustrated in FIG. 12 will be described in more detail with reference to FIGS. 13A, 14A, and 15A.

In some embodiments, the touch display device 100 can have a variety of vertical structures according to the respective location (or type) of each of a touch electrode layer on which the first touch electrode TE11 is disposed and a touch line layer in which the first touch line TL1 is disposed.

Figure 13A:
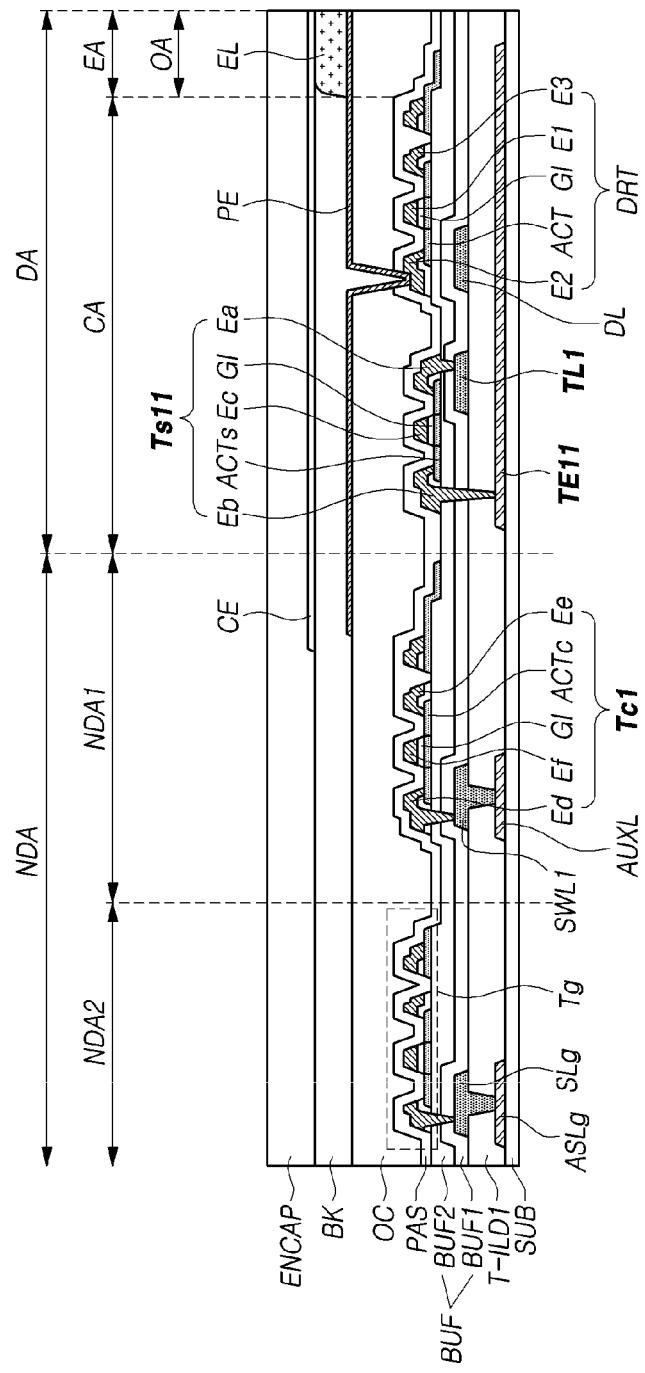
FIG. 13A is a cross-sectional view of the touch display device according to aspects of the present disclosure.
Figure 14A:
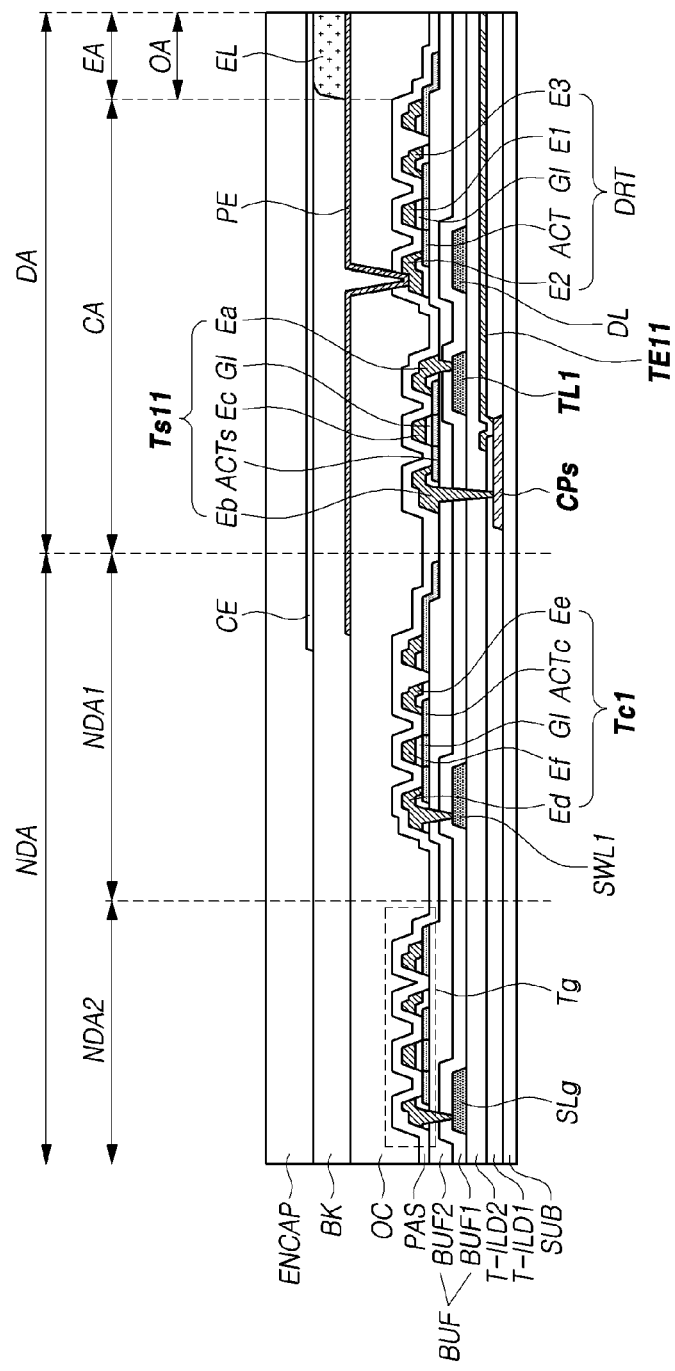
FIG. 14A is a cross-sectional view of the touch display device according to aspects of the present disclosure.
Figure 15A:
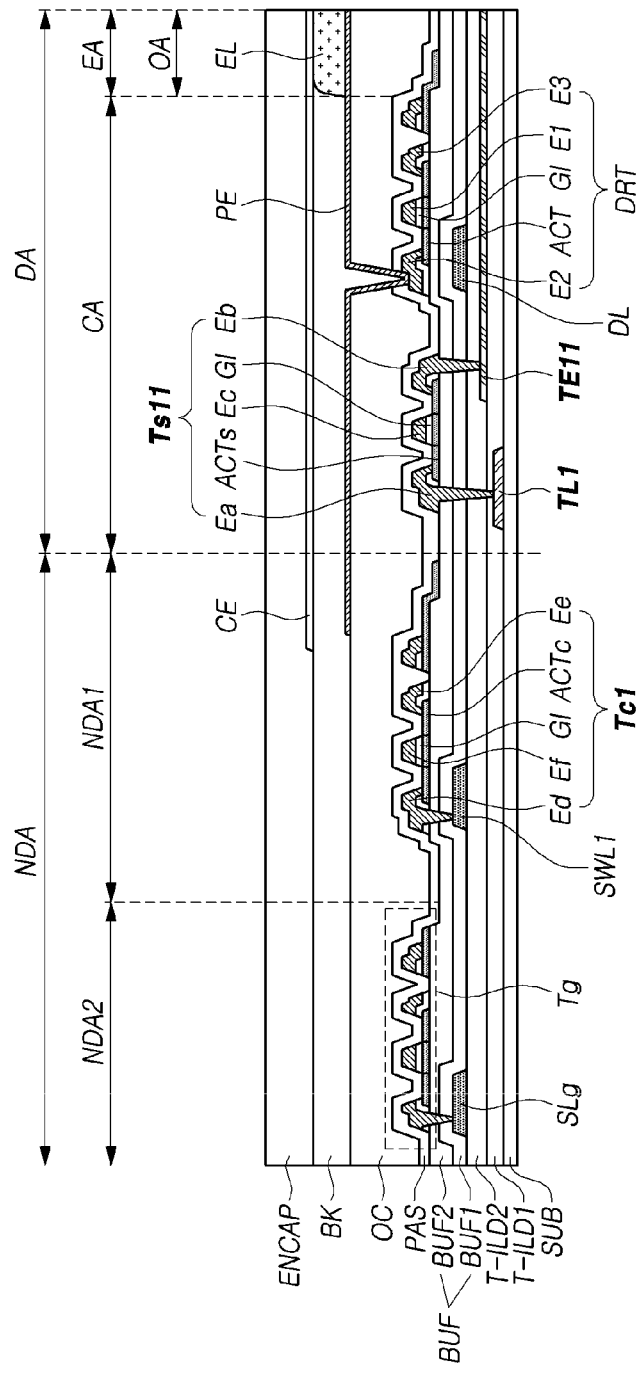
FIG. 15A is a cross-sectional view of the touch display device according to aspects of the present disclosure.

Example vertical structures applied to the advanced touch sensor structure of the touch display device 100 according to aspects of the present disclosure can include a first vertical structure of FIG. 13A, a second vertical structure of FIG. 14A, and a third vertical structure of FIG. 15A. Hereinafter, corresponding discussions are conducted based on an example in which the touch display device 100 according to aspects of the present disclosure uses bottom emission display technology in which the rear surface of the substrate SUB is served as the viewing surface. In such an example, the pixel electrode PE can be a transparent electrode (transparent metal) and the common electrode CE can be a reflective electrode (reflective metal).

Figure 13B:
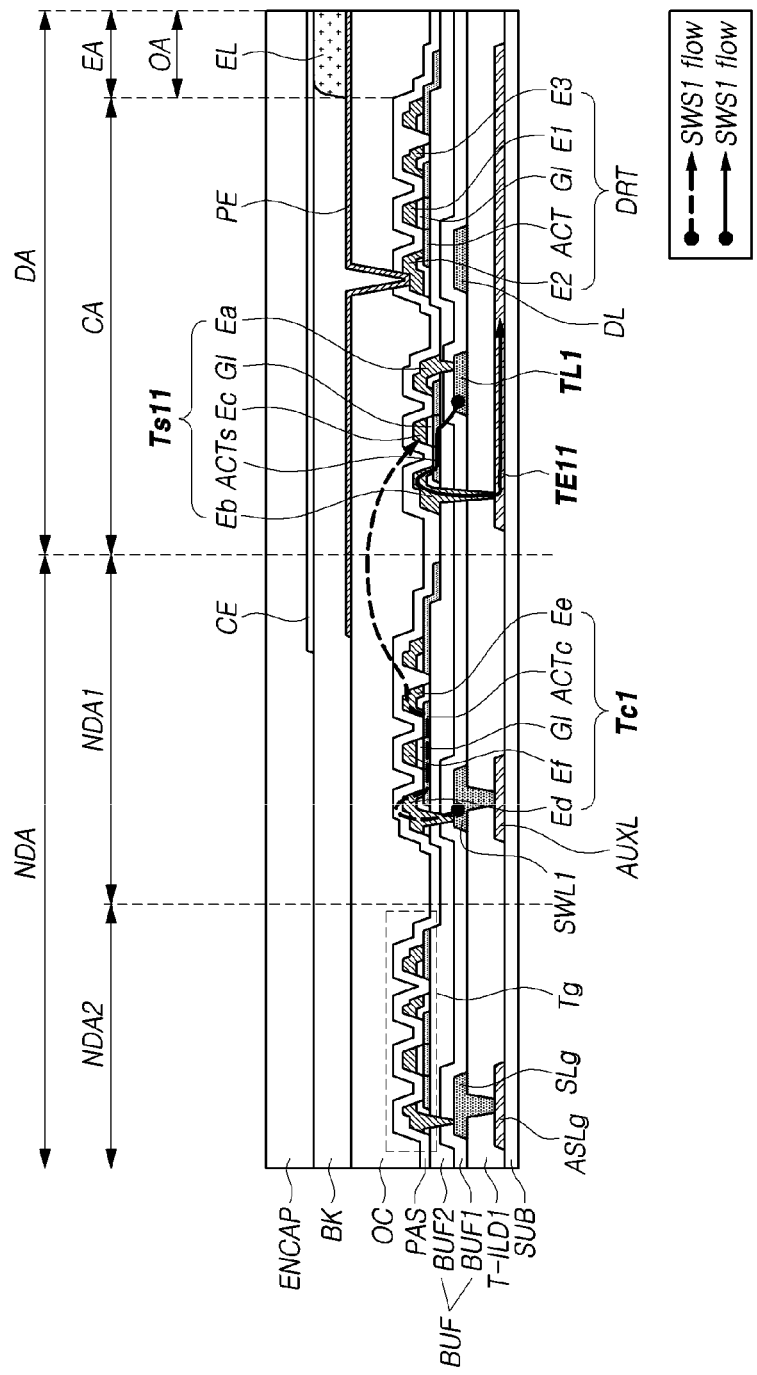
FIG. 13B is a cross-sectional view in which the flow of a first switching signal and the flow of a first touch driving signal are added to the cross-sectional view of FIG. 13A.

FIG. 13A is a cross-sectional view of the touch display device 100 according to aspects of the present disclosure. FIG. 13B is a cross-sectional view in which the flow of the first switching signal SWS1 and the flow of a first touch driving signal are added to the cross-sectional view of FIG. 13A.

Referring to FIG. 13A, in some embodiments, the display area DA of the touch display device 100 can include a light emitting area EA of the first sub-pixel SP1 and a circuit area CA of the first sub-pixel SP1. In the example where the touch display device 100 uses the bottom emission display technology, the light emitting area EA of the first sub-pixel SP1 and the circuit area CA of the first sub-pixel SP1 may not overlap each other.

The light emitting area EA of the first sub-pixel SP1 can correspond to an opening OA of a bank BK. A first driving transistor DRT included in the first sub-pixel SP1 can be disposed in the circuit area CA of the first sub-pixel SP1.

In some embodiments, the first touch electrode TE11 and the first touch driving transistor Ts11 can be disposed in the display area DA of the touch display device 100.

The non-display area NDA can include a first non-display area NDA1 and a second non-display area NDA2. The first control transistor Tc1 can be disposed in the first non-display area NDA1, and the gate driving transistor Tg included in the gate driving circuit 130 can be disposed in the second non-display area NDA2.

In some embodiments, the first driving transistor DRT included in the touch display device 100 can include a second active layer ACT located on a buffer layer BUF, a source electrode E2 electrically connected to a first side of the second active layer ACT, a drain electrode E3 electrically connected to a second side of the second active layer ACT, and a gate electrode E1 overlapping a portion of the second active layer ACT.

In some embodiments, the touch display device 100 can include a protective film PAS disposed on the first touch driving transistor Ts11 and the first driving transistor DRT, an overcoat layer OC on the protective film PAS, a pixel electrode PE disposed on the overcoat layer OC and electrically connected to the source electrode E2 or the drain electrode E3 of the first driving transistor DRT through the through-holes of the overcoat layer OC and the protective film PAS, the bank BK located on the pixel electrode PE and having an opening OA, an emission layer EL located on the pixel electrode PE in the opening OA of the bank BK, and a common electrode CE disposed on the emission layer EL.

In the touch display device 100 according to aspects of the present disclosure, the pixel electrode PE can be a transparent electrode, and the common electrode CE can be a reflective electrode.

In some embodiments, the touch display device 100 can further include an encapsulation layer ENCAP on the common electrode CE. For example, the encapsulation layer ENCAP can be a metal encapsulation film.

In the touch display device 100 according to aspects of the present disclosure, the first touch driving transistor Ts11 and the first touch electrode TE11 can overlap the bank BK.

The touch display device 100 according to aspects of the present disclosure can include the substrate SUB including the display area DA and the non-display area NDA, the first touch electrode TE11 disposed on the substrate SUB in the display area DA, the first touch line TL1 electrically connected to a touch pad disposed in the non-display area NDA, the buffer layer BUF disposed on or over the first touch electrode TE11 or the first touch line TL1, the first driving transistor DRT disposed on the buffer layer BUF and included in the first sub-pixel SP1 overlapping the first touch electrode TE11, the first gate line GL connected to the first sub-pixel SP1, the first touch gate line TGL1 disposed in parallel to the first gate line GL, and the first touch driving transistor Ts11 disposed in the display area DA and controlling a connection between the first touch line TL1 and the first touch electrode TE11.

In the touch display device 100 according to aspects of the present disclosure, the first touch driving transistor Ts11 can include a first active layer ACTs located on the buffer layer BUF, a first node electrode Ea electrically connected to the first touchline TL1 and electrically connected to a first side of the first active layer ACTs, a second node electrode Eb electrically connected to the first touchline TL1 and electrically connected to a second side of the first active layer ACTs, and a third node electrode Ec located on a gate insulating film GI on the first active layer ACTs, and electrically connected to the first touch gate line TGL1 or formed by the extending of the first touch gate line TGL1.

For example, the first node electrode Ea of the first touch driving transistor Ts11 can be a drain electrode or a source electrode; the second node electrode Eb of the first touch driving transistor Ts11 can be the source electrode or the drain electrode; and the third node electrode Ec of the first touch driving transistor Ts11 can be a gate electrode.

The first active layer ACTs of the first touch driving transistor Ts11 and the second active layer ACT of the first driving transistor DRT can be located in the same layer.

All of the first node electrode Ea, the second node electrode Eb, the third node electrode Ec of the first touch driving transistor Ts11, and the source electrode E2, the drain electrode E3 and the gate electrode E1 of the first driving transistor DRT can be located in the same layer.

In some embodiments, the touch display device 100 can further include a first touch interlayer insulating film T-ILD1 disposed on the substrate SUB and under the buffer layer BUF.

In the touch display device 100 according to aspects of the present disclosure, the first touch electrode TE11 can be located between the substrate SUB and the first touch interlayer insulating film T-ILD1, and the first touch line TL1 can be located between the first touch interlayer insulating film T-ILD1 and the buffer layer BUF.

In the touch display device 100 according to aspects of the present disclosure, the first node electrode Ea of the first touch driving transistor Ts11 can be electrically connected to the first touch line TL1 through the through-holes of the gate insulating film GI and the buffer layer BUF.

In the touch display device 100 according to aspects of the present disclosure, the second node electrode Eb of the first touch driving transistor Ts11 can be electrically connected to the first touch electrode TE11 through the through-holes of the gate insulating film GI, the buffer layer BUF, and the first touch interlayer insulating film T-ILD1.

In some embodiments, the touch display device 100 can further include a first data line DL connected to the first sub-pixel SP1, and the first data line (DL) can be located between the first touch interlayer insulating film T-ILD1 and the buffer layer BUF. The first data line DL can include the same material as the first touch line TL1.

In some embodiments, the touch display device 100 can further include a light shield pattern overlapping a channel region of the active layer ACT of the first driving transistor DRT. The layer on which the light shield pattern is disposed can be referred to as a light shield layer. Here, a layer in which the first data line DL and the first touch line TL1 are disposed can be the light shield layer.

In a plan view, the first data line DL and the first touch line TL1 can be arranged in parallel to each other.

In some embodiments, the touch display device 100 can be further include the first switching signal line SWL1 for delivering a first switching signal SWS1 to turn on the first touch driving transistor Ts11, and the first control transistor Tc1 for controlling a connection between the first switching signal line SWL1 and the first touch gate line TGL1.

In the touch display device 100 according to aspects of the present disclosure, the first switching signal line SWL1 and the first control transistor Tc1 can be located in the first non-display area NDA1 included in the non-display area NDA.

In the touch display device 100 according to aspects of the present disclosure, the first switching signal line SWL1 can be located between the first touch interlayer insulating film T-ILD1 and the buffer layer BUF. The first switching signal line SWL1 can include the same material as the first data line DL or the first touch line TL1 in the display area DA. For example, all of the first switching signal line SWL1, the first data line DL, and the first touch line TL1 can be located in the light shield layer.

In some embodiments, the touch display device 100 can further include an auxiliary signal line AUXL located between the substrate SUB and the first touch interlayer insulating film T-ILD1 and disposed in the non-display area NDA.

The auxiliary signal line AUXL can be electrically connected to the first switching signal line SWL1 through a contact hole of the first touch interlayer insulating film T-ILD1. As the first switching signal line SWL1 is connected to the auxiliary signal line AUXL, the resistance of the first switching signal line SWL1 can be reduced.

The auxiliary signal line AUXL can include the same material as the first touch electrode TE11 and be located in the same layer as the first touch electrode TE11.

In the touch display device 100 according to aspects of the present disclosure, the gate driving circuit 130 can be disposed in the second non-display area NDA2. Accordingly, in some embodiments, the touch display device 100 can further include a gate driving transistor Tg disposed in the second non-display area NDA2.

The gate driving transistor Tg can be a transistor for outputting a gate signal to the first gate line GL. The gate driving transistor Tg can be one of a pull-up transistor and a pull-down transistor connected to the first gate line GL and included in the gate driving circuit 130.

As described above, the first control transistor Tc1 for outputting a first switching signal SWS1 to the first touch gate line TGL1 can be disposed in the first non-display area NDA1, and the gate driving transistor Tg for outputting a gate signal to the first gate line GL can be disposed in the second non-display area NDA2.

A gate driving related signal line SLg electrically connected to the source node or drain node of the gate driving transistor Tg can be disposed on the first touch interlayer insulating film T-ILD1.

An auxiliary gate driving related line ASLg can be disposed between the substrate SUB and the first touch interlayer insulating film T-ILD1. The gate driving related signal line SLg can be electrically connected to the auxiliary gate driving related line ASLg through a through-hole of the first touch interlayer insulating film T-ILD1.

The gate driving related signal line SLg can be disposed in the light shield layer along with the first switching signal line SWL1, the first data line DL, and the first touch line TL1. The auxiliary gate driving related line ASLg can be located in the same layer as the auxiliary signal line AUXL and the first touch electrode TE11.

The buffer layer BUF can be a multilayer including a first buffer layer BUF1 and a second buffer layer BUF2.

The metal patterns can be a single metal layer or a multi-metal layer. Referring to FIG. 13B, when the first control transistor Tc1 is turned on, a first switching signal SWC1 can be applied to the third node electrode Ec, which is the gate electrode of the first touch driving transistor Ts11, through the first control transistor Tc1. When the first switching signal SWC1 has a turn-on level voltage, the first touch driving transistor Ts11 can be turned on.

Referring to FIG. 13B, the gate electrode Ef of the first control transistor Tc1 can be electrically connected to the gate electrode Ec of the first touch driving transistor Ts11.

When the first touch driving transistor Ts11 is turned on, a first touch driving signal TDS1 output to the first touch line TL1 located between the first touch interlayer insulating film T-ILD1 and the buffer layer BUF can be supplied to the first touch electrode TE11 located between the substrate SUB and the first touch interlayer insulating film T-ILD1 through the first touch driving transistor Ts11. Thereafter, the touch driving circuit 210 can detect an electrical signal from the first touch electrode TE11 to sense a capacitance, or a change in the capacitance, in the first touch electrode TE11. In this case, such a sensing (detection) path can be opposite to the supplying (transmission) path of the first touch driving signal TDS1.

Hereinafter, a second vertical structure of the advanced touch sensor structure of the touch display device 100 according to aspects of the present disclosure will be described with reference to FIGS. 14A and 14B.

FIG. 14A is a cross-sectional view of the touch display device 100 according to aspects of the present disclosure. FIG. 14B is a cross-sectional view in which the flow of a first switching signal SWS1 and the flow of a first touch driving signal are added to the cross-sectional view of FIG. 14A. Some of the elements in the vertical structure of FIGS. 13A and 13B are substantially equally used in the vertical structure of FIGS. 13A and 13B, and like elements are labeled with like reference numbers, the details of which are omitted here for brevity and convenience of description. Thus, discussions that follow will be focused on different configurations or elements from those in the vertical structure of FIGS. 13A and 13B.

Referring to FIG. 14A, in some embodiments, the touch display device 100 can further include a first touch interlayer insulating film T-ILD1 on the substrate SUB, and a second touch interlayer insulating film T-ILD2 disposed on the first touch interlayer insulating film T-ILD1 and under the buffer layer BUF.

In the touch display device 100 according to aspects of the present disclosure, the first touch electrode TE11 can be located between the first touch interlayer insulating film T-ILD1 and the second touch interlayer insulating film T-ILD2.

In the touch display device 100 according to aspects of the present disclosure, the first touch line TL1 can be located between the first touch interlayer insulating film T-ILD1 and the buffer layer BUF.

In the touch display device 100 according to aspects of the present disclosure, the first node electrode Ea of the first touch driving transistor Ts11 can be electrically connected to the first touch line TL1 through the through-holes of the gate insulating film GI and the buffer layer BUF.

In the touch display device 100 according to aspects of the present disclosure, the second node electrode Eb of the first touch driving transistor Ts11 can be electrically connected to the first touch electrode TE11 through the through-holes of the gate insulating film GI, the buffer layer BUF, and the second touch interlayer insulating film T-ILD2.

The second node electrode Eb of the first touch driving transistor Ts11 can be electrically connected to the first touch electrode TE11 located on the first touch interlayer insulating film T-ILD1 through a connection pattern CPs.

The connection pattern CPs can be located between the substrate SUB and the first touch interlayer insulating film T-ILD1.

The first touch electrode TE11 can be electrically connected to a first side of the connection pattern CPs through a through-hole of the first touch interlayer insulating film T-ILD1.

The second node electrode Eb of the first touch driving transistor Ts11 can be electrically connected to a second side of the connection pattern CPs through the through-holes of the gate insulating film GI, the buffer layer BUF, the second touch interlayer insulating film T-ILD2, and the first touch interlayer insulating film T-ILD1.

Referring to FIG. 14A, in some embodiments, the touch display device 100 can further include a first data line DL connected to the first sub-pixel SP1. The first data line DL can be located between the second touch interlayer insulating film T-ILD2 and the buffer layer BUF.

The first data line DL can include the same material as the first touch line TL1. For example, a layer in which the first data line DL and the first touch line TL1 are disposed can be a light shield layer.

Figure 14B:
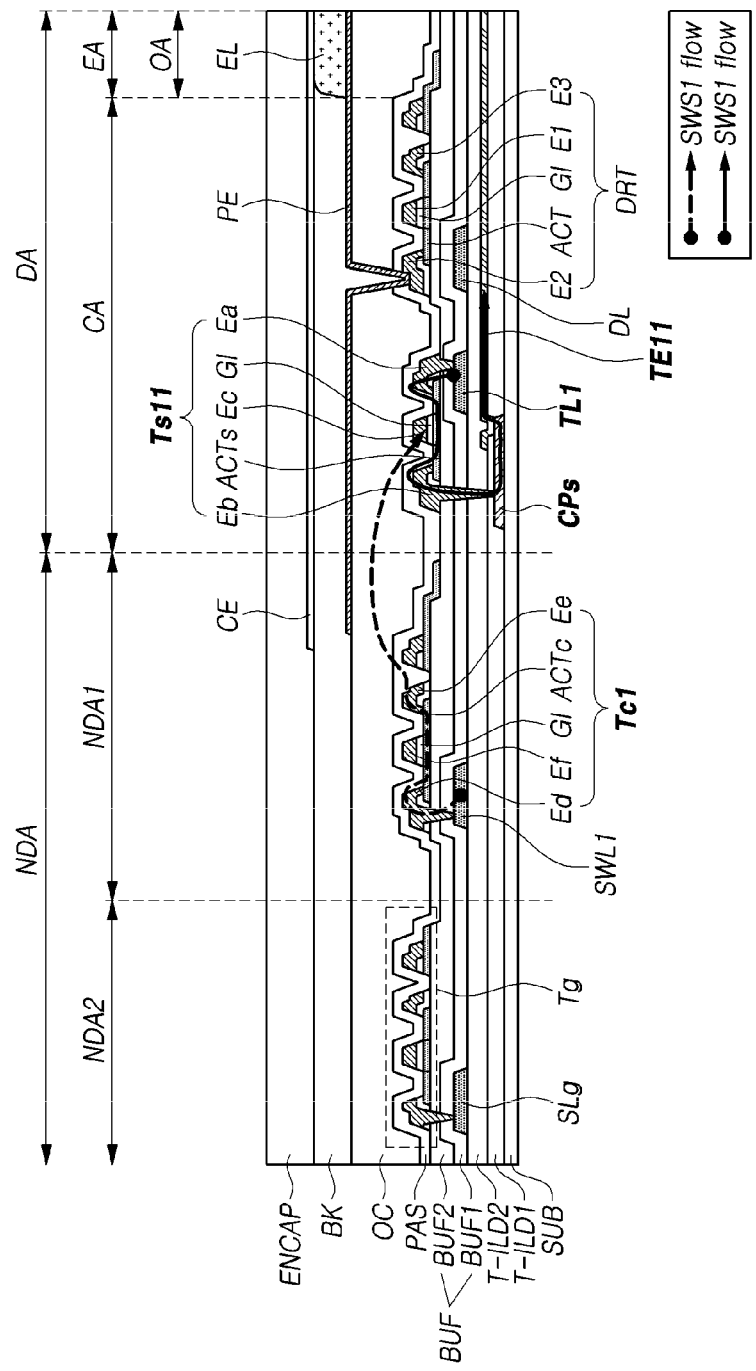
FIG. 14B is a cross-sectional view in which the flow of a first switching signal and the flow of a first touch driving signal are added to the cross-sectional view of FIG. 14A.

Referring to FIG. 14B, when the first control transistor Tc1 is turned on, a first switching signal SWC1 can be applied to the third node electrode Ec, which is the gate electrode of the first touch driving transistor Ts11, through the first control transistor Tc1. When the first switching signal SWC1 has a turn-on level voltage, the first touch driving transistor Ts11 can be turned on.

The gate electrode Ef of the first control transistor Tc1 can be electrically connected to the gate electrode Ec of the first touch driving transistor Ts11.

When the first touch driving transistor Ts11 is turned on, a first touch driving signal TDS1 output to the first touch line TL1 located between the second touch interlayer insulating film T-ILD2 and the buffer layer BUF can be supplied to the first touch electrode TE11 located between the first touch interlayer insulating film T-ILD1 and the second touch interlayer insulating film T-ILD2 through the first touch driving transistor Ts11. Thereafter, the touch driving circuit 210 can detect an electrical signal from the first touch electrode TE11 to sense a capacitance, or a change in the capacitance, in the first touch electrode TE11. In this case, such a sensing (detection) path can be opposite to the supplying (transmission) path of the first touch driving signal TDS1.

Figure 15B:
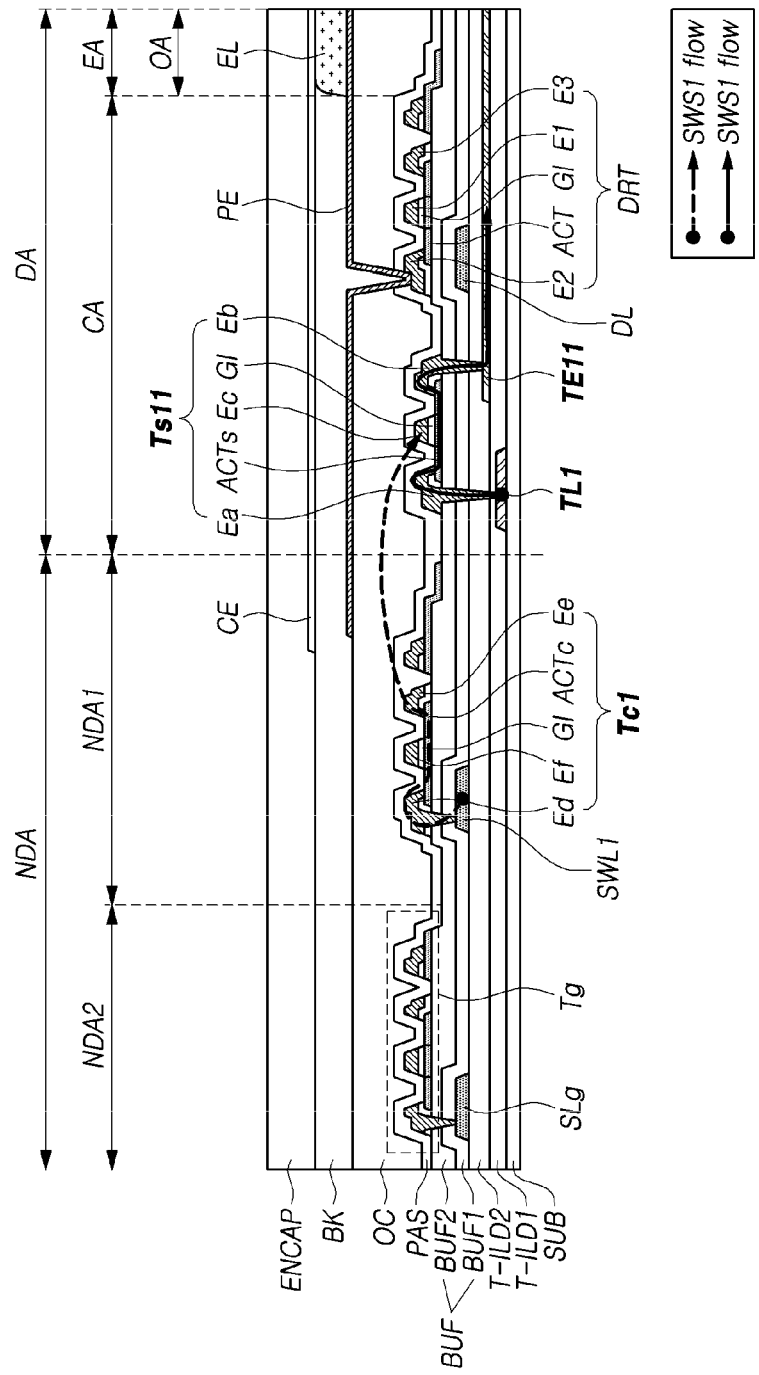
FIG. 15B is a cross-sectional view in which the flow of a first switching signal and the flow of a first touch driving signal are added to the cross-sectional view of FIG. 15A.

Hereinafter, a third vertical structure of the advanced touch sensor structure of the touch display device 100 according to aspects of the present disclosure will be described with reference to FIGS. 15A and 15B. FIG. 15A is a cross-sectional view of the touch display device 100 according to aspects of the present disclosure. FIG. 15B is a cross-sectional view in which the flow of a first switching signal SWS1 and the flow of a first touch driving signal are added to the cross-sectional view of FIG. 15A. Some of the elements in the vertical structure of FIGS. 13A and 13B are substantially equally used in the vertical structure of FIGS. 15A and 15B, and like elements are labeled with like reference numbers, the details of which are omitted here for brevity and convenience of description. Thus, discussions that follow will be focused on different configurations or elements from those in the vertical structure of FIGS. 13A and 13B.

Referring to FIG. 15A, in some embodiments, the touch display device 100 can further include a first touch interlayer insulating film T-ILD1 on the substrate SUB, and a second touch interlayer insulating film T-ILD2 disposed on the first touch interlayer insulating film T-ILD1 and under the buffer layer BUF.

In the touch display device 100 according to aspects of the present disclosure, the first touch electrode TE11 can be located between the first touch interlayer insulating film T-ILD1 and the second touch interlayer insulating film T-ILD2.

In the touch display device 100 according to aspects of the present disclosure, the first touch line TL1 can be located between the substrate SUB and the first touch interlayer insulating film T-ILD1.

In the touch display device 100 according to aspects of the present disclosure, the first node electrode Ea of the first touch driving transistor Ts11 can be electrically connected to the first touch line TL1 through the through-holes of the gate insulating film GI, the buffer layer BUF, the second touch interlayer insulating film T-ILD2, and the first touch interlayer insulating film T-ILD1.

In the touch display device 100 according to aspects of the present disclosure, the second node electrode Eb of the first touch driving transistor Ts11 can be electrically connected to the first touch electrode TE11 through the through-holes of the gate insulating film GI, the buffer layer BUF, and the second touch interlayer insulating film T-ILD2.

Referring to FIG. 15B, when the first control transistor Tc1 is turned on, a first switching signal SWC1 can be applied to the third node electrode Ec, which is the gate electrode of the first touch driving transistor Ts11, through the first control transistor Tc1. When the first switching signal SWC1 has a turn-on level voltage, the first touch driving transistor Ts11 can be turned on.

The gate electrode Ef of the first control transistor Tc1 can be electrically connected to the gate electrode Ec of the first touch driving transistor Ts11.

When the first touch driving transistor Ts11 is turned on, a first touch driving signal TDS1 output to the first touch line TL1 located between the substrate SUB and the first touch interlayer insulating film T-ILD1 can be supplied to the first touch electrode TE11 located between the first touch interlayer insulating film T-ILD1 and the second touch interlayer insulating film T-ILD2 through the first touch driving transistor Ts11. Thereafter, the touch driving circuit 210 can detect an electrical signal from the first touch electrode TE11 to sense a capacitance, or a change in the capacitance, in the first touch electrode TE11. In this case, such a sensing (detection) path can be opposite to the supplying (transmission) path of the first touch driving signal TDS1.

Referring to FIGS. 13A, 14A and 15A, a metal layer between the first touch interlayer insulating film T-ILD1 or the second touch interlayer insulating film T-ILD2 and the buffer layer BUF can be referred to as a light shield layer; a metal layer between the first touch interlayer insulating film T-ILD1 and the second touch interlayer insulating film T-ILD2 can be referred to as a touch sensor metal layer; and a metal layer between the substrate SUB and the first touch interlayer insulating film T-ILD1 can be referred to as a touch bridge metal layer.

In the example of the vertical structure of FIG. 13A, since only the first touch interlayer insulating film T-ILD1 of the first touch interlayer insulating film T-ILD1 and the second touch interlayer insulating film T-ILD2 is used, the number of masks or the process of masking used to manufacture the panel can be reduced.

In the example of the vertical structure of FIG. 14A, even when a location variance (or shift) between layers is undesirably caused due to a process error while manufacturing the panel, a load variance between the first data line DL and the first touch line TL1 can be small because the first data line DL and the first touch line TL1 are arranged parallel to each other in a plan view and are formed together in the light shield layer.

In the example of the vertical structure of FIG. 15A, since the first data line DL and the first touch line TL1 arranged parallel to each other in a plan view are located in different layers from each other, when a location variance (or shift) between layers is undesirably caused due to a process error while manufacturing the panel, there is a probability of allowing a separation distance between the first data line DL and the first touch line TL1 to undesirably vary. Accordingly, a load variation between the first data line DL and the first touch line TL1 arranged parallel to each other in a plan view can increase.

In the example of the vertical structure of FIG. 15A, since the first data line DL and the first touch line TL1 arranged parallel to each other in a plan view are located in different layers from each other, the first data line DL and the first touch line TL1 can be disposed to become closer to each other. Accordingly, the size of the circuit area CA of the first sub-pixel SP1 can be reduced, and accordingly, the size of the light emitting area EA of the first sub-pixel SP1 can be increased. In consequence, an aperture ratio of the display panel 110 can increase.

According to the embodiments described herein, the touch display device 100 can be provided that has the advanced touch sensor structure capable of reducing the number of touch lines, the number of touch pads, and the number of touch channels even when the number of touch electrodes increases.

According to the embodiments described herein, the touch display device 100 can be provided that has the advanced touch sensor structure that not only enables the number of touch lines, the number of touch pads, and the number of touch channels to be reduced, but enables high touch resolution to be realized.

The above description has been presented to enable any person skilled in the art to make and use the technical idea of the present invention, and has been provided in the context of a particular application and its requirements. Various modifications, additions and substitutions to the described embodiments will be readily apparent to those skilled in the art, and the general principles defined herein can be applied to other embodiments and applications without departing from the spirit and scope of the present invention. The above description and the accompanying drawings provide an example of the technical idea of the present invention for illustrative purposes only. For example, the disclosed embodiments are intended to illustrate the scope of the technical idea of the present invention.

Thus, the scope of the present invention is not limited to the embodiments shown, but is to be accorded the widest scope consistent with the claims. The scope of protection of the present invention should be construed based on the following claims, and all technical ideas within the scope of equivalents thereof should be construed as being included within the scope of the present invention.

What is claimed is:

1. A touch display device comprising:
a substrate comprising a display area and a non-display area;
a first touch electrode disposed on the substrate in the display area;
a first touch line electrically connected to a touch pad disposed in the non-display area;
a buffer layer disposed on the first touch electrode or the first touch line;
a first driving transistor disposed on the buffer layer and included in a first subpixel overlapping the first touch electrode;
a first gate line connected to the first subpixel;
a first touch gate line disposed in parallel to the first gate line; and
a first touch driving transistor disposed in the display area, and configured to control a connection between the first touch line and the first touch electrode,
wherein the touch display device further comprises a first switching signal line for delivering a first switching signal for turning on the first touch driving transistor, and a first control transistor for controlling a connection between the first touch gate line and the first switching signal line.

2. The touch display device according to claim 1, wherein the first touch driving transistor comprises:
a first active layer disposed on the buffer layer;
a first node electrode electrically connected to the first touch line, and electrically connected to a first side of the first active layer;
a second node electrode electrically connected to the first touch electrode, and electrically connected to a second side of the first active layer; and
a third node electrode disposed on a gate insulating film on the first active layer, and electrically connected to the first touch gate line or formed by the extending of the first touch gate line.

3. The touch display device according to claim 2, further comprising a first touch interlayer insulating film disposed on the substrate and under the buffer layer,
wherein the first touch electrode is located between the substrate and the first touch interlayer insulating film, and the first touch line is located between the first touch interlayer insulating film and the buffer layer.

4. The touch display device according to claim 3, wherein the first node electrode of the first touch driving transistor is electrically connected to the first touch line through through-holes of the gate insulating film and the buffer layer, or
wherein the second node electrode of the first touch driving transistor is electrically connected to the first touch electrode through through-holes of the gate insulating film, the buffer layer, and the first touch interlayer insulating film.

5. The touch display device according to claim 3, further comprising a first data line connected to the first subpixel,
wherein the first data line is located between the first touch interlayer insulating film and the buffer layer and comprises a same material as the first touch line.

6. The touch display device according to claim 5, wherein the first data line and the first touch line are located in different layers from each other.

7. The touch display device according to claim 2, further comprising:
a first touch interlayer insulating film disposed on the substrate; and
a second touch interlayer insulating film disposed on the first touch interlayer insulating film and under the buffer layer,
wherein the first touch electrode is located between the first touch interlayer insulating film and the second touch interlayer insulating film, and the first touch line is located between the first touch interlayer insulating film and the buffer layer.

8. The touch display device according to claim 7, wherein the first node electrode of the first touch driving transistor is electrically connected to the first touch line through through-holes of the gate insulating film and the buffer layer, or
wherein the second node electrode of the first touch driving transistor is electrically connected to the first touch electrode through through-holes of the gate insulating film, the buffer layer, and the second touch interlayer insulating film.

9. The touch display device according to claim 7, further comprising a connection pattern located between the substrate and the first touch interlayer insulating film,
wherein the first touch electrode is electrically connected to a first side of the connection pattern through a through-hole of the first touch interlayer insulating film, and the second node electrode of the first touch driving transistor is electrically connected to a second side of the connection pattern through through-holes of the gate insulating film, the buffer layer, the second touch interlayer insulating film, and the first touch interlayer insulating film.

10. The touch display device according to claim 7, further comprising a first data line connected to the first subpixel,
wherein the first data line is located between the second touch interlayer insulating film and the buffer layer, and comprises a same material as the first touch line.

11. The touch display device according to claim 2, further comprising:
a first touch interlayer insulating film disposed on the substrate; and
a second touch interlayer insulating film disposed on the first touch interlayer insulating film and under the buffer layer,
wherein the first touch electrode is located between the first touch interlayer insulating film and the second touch interlayer insulating film, and the first touch line is located between the substrate and the first touch interlayer insulating film.

12. The touch display device according to claim 11, wherein the first node electrode of the first touch driving transistor is electrically connected to the first touch line through through-holes of the gate insulating film, the buffer layer, the second touch interlayer insulating film, and the first touch interlayer insulating film, or
wherein the second node electrode of the first touch driving transistor is electrically connected to the first touch electrode through through-holes of the gate insulating film, the buffer layer, and the second touch interlayer insulating film.

13. The touch display device according to claim 1, further comprising a gate driving transistor for outputting a gate signal to the first gate line,
wherein the non-display area comprises a first non-display area and a second non-display area, and
wherein the first control transistor for outputting the first switching signal to the first touch gate line is disposed in the first non-display area, and the gate driving transistor for outputting the gate signal to the first gate line is disposed in the second non-display area.

14. The touch display device according to claim 1, further comprising a first touch interlayer insulating film disposed on the substrate and under the buffer layer,
wherein the first switching signal line is located between the first touch interlayer insulating film and the buffer layer, and the first switching signal line comprises a same material as a first data line connected to the first subpixel or the first touch line.

15. They touch display device according to claim 1, further comprising:
a protective film disposed on the first touch driving transistor and the first driving transistor;
an overcoat layer disposed on the protective film;
a pixel electrode disposed on the overcoat layer and electrically connected to the source electrode or the drain electrode of the first driving transistor through through-holes of the overcoat layer and the protective film;
a bank disposed on the pixel electrode and having an opening;
an emission layer disposed on the pixel electrode in the opening of the bank; and
a common electrode disposed on the emission layer,
wherein the pixel electrode is a transparent electrode, and the common electrode is a reflective electrode, and
wherein the first touch driving transistor and the first touch electrode overlap the bank.

16. The touch display device according to claim 1, wherein the first touch electrode overlaps two or more sub-pixels including the first sub-pixel, and comprises a mesh-type touch metal having two or more openings, and
wherein each of the two or more openings corresponds to a light emitting area of at least one sub-pixel.

17. A touch display device comprising:
a substrate comprising a display area and a non-display area;
a first touch electrode and a second touch electrode disposed in the display area;
a first driving transistor disposed adjacent to the first touch electrode;
a second driving transistor disposed adjacent to the second touch electrode;
a first touch line electrically connected to the first touch electrode through a first touch driving transistor and electrically connected to the second touch electrode through a second touch driving transistor;
a first touch gate line electrically connected to a gate node of the first touch driving transistor; and
a second touch gate line electrically connected to a gate node of the second touch driving transistor,
wherein the touch display device further comprises:
a first switching signal line for delivering a first switching signal for turning on the first touch driving transistor;
a second switching signal line for delivering a second switching signal for turning on the second touch driving transistor;
a first control transistor for controlling a connection between the first touch gate line and the first switching signal line; and
a second control transistor for controlling a connection between the second touch gate line and the second switching signal line, and
wherein the first control transistor and the second control transistor are disposed in the non-display area.

18. A touch display device comprising:
a substrate comprising a display area and a non-display area;
a first touch electrode and a second touch electrode disposed in the display area;
a first touch driving transistor disposed adjacent to the first touch electrode;
a second touch driving transistor disposed adjacent to the second touch electrode;
a first touch line electrically connected to the first touch electrode through the first touch driving transistor and electrically connected to the second touch electrode through the second touch driving transistor; and
a controlling circuit disposed to control the first touch driving transistor and the second touch driving transistor, and to supply touch driving signal to the first touch electrode or the second touch electrode through the first touch line,
wherein the touch display device further comprises a first switching signal line for delivering a first switching signal for turning on the first touch driving transistor and the second touch driving transistor.

* * * * *